(12) United States Patent
Hwang et al.

(10) Patent No.: US 11,522,149 B2
(45) Date of Patent: Dec. 6, 2022

(54) COLOR-CONVERTING SUBSTRATE INCLUDING SHARED LIGHT-EMITTING AREAS, DISPLAY DEVICE INCLUDING THE SAME AND METHOD FOR MANUFACTURING THE SAME

(71) Applicant: Samsung Display Co., LTD., Yongin-si (KR)

(72) Inventors: Tae Hyung Hwang, Seoul (KR); Jiseong Yang, Suwon-si (KR); Seon Uk Lee, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/940,395

(22) Filed: Jul. 28, 2020

(65) Prior Publication Data

US 2021/0111363 A1 Apr. 15, 2021

(30) Foreign Application Priority Data

Oct. 11, 2019 (KR) .......................... 10-2019-0126016

(51) Int. Cl.
*H01L 29/08* (2006.01)
*H01L 51/50* (2006.01)
*H01L 51/56* (2006.01)
*H01L 27/32* (2006.01)

(52) U.S. Cl.
CPC ........ *H01L 51/5036* (2013.01); *H01L 27/322* (2013.01); *H01L 51/56* (2013.01); *H01L 2251/5369* (2013.01)

(58) Field of Classification Search
CPC .................................................. H01L 51/5036
See application file for complete search history.

(56) References Cited

U.S. PATENT DOCUMENTS

| | | | | |
|---|---|---|---|---|
| 2015/0001486 | A1* | 1/2015 | Kim ................... | H01L 27/3246 438/23 |
| 2017/0110522 | A1* | 4/2017 | Lee .................... | H01L 27/3276 |
| 2017/0125740 | A1* | 5/2017 | Lee .................... | H01L 27/3246 |
| 2019/0312228 | A1* | 10/2019 | Sonoda ................ | H01L 51/50 |
| 2019/0371872 | A1* | 12/2019 | Nendai ............... | H01L 51/5209 |
| 2021/0202653 | A1* | 7/2021 | Cho .................... | H01L 27/3246 |
| 2021/0217835 | A1* | 7/2021 | Park .................... | H01L 27/3272 |
| 2021/0249478 | A1* | 8/2021 | Oh ...................... | H01L 27/322 |
| 2021/0273022 | A1* | 9/2021 | Park .................... | H01L 51/5271 |
| 2021/0280750 | A1* | 9/2021 | Park .................... | H01L 51/52 |

* cited by examiner

*Primary Examiner* — Caleb E Henry
(74) *Attorney, Agent, or Firm* — H.C. Park & Associates, PLC

(57) ABSTRACT

A color-converting substrate including light-emitting areas and a light blocking area surrounding the light-emitting areas, the light-emitting areas including first light-emitting areas configured to emit a first color light, a partition wall including a first opening continuously overlapping the first light-emitting areas and a first portion of the light-blocking area disposed between the first light-emitting areas, a first color-converting layer including a wavelength-converting material and disposed in the first opening to overlap the first light-emitting areas and the first portion of the light-blocking area, and a color filter layer including a portion configured to block the first color light, the color filter layer overlapping the first color-converting layer and the first portion of the light-blocking area.

19 Claims, 28 Drawing Sheets

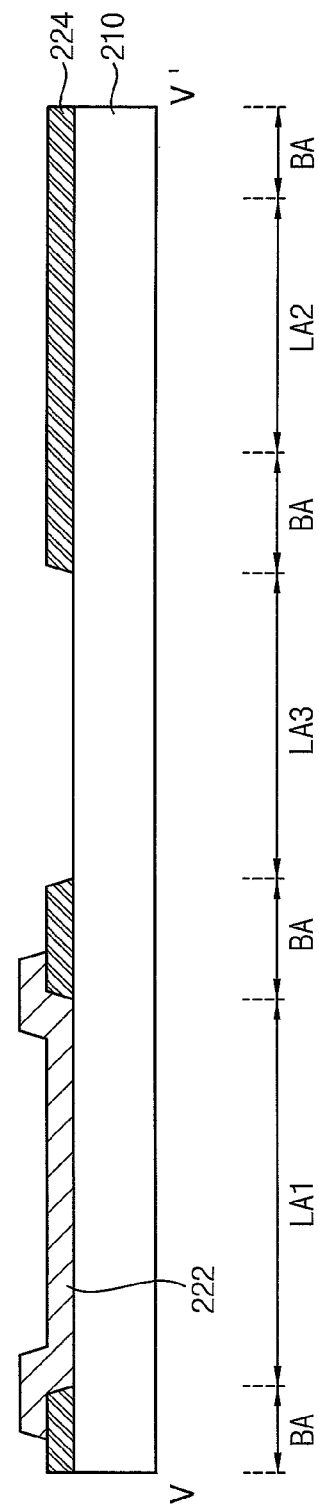

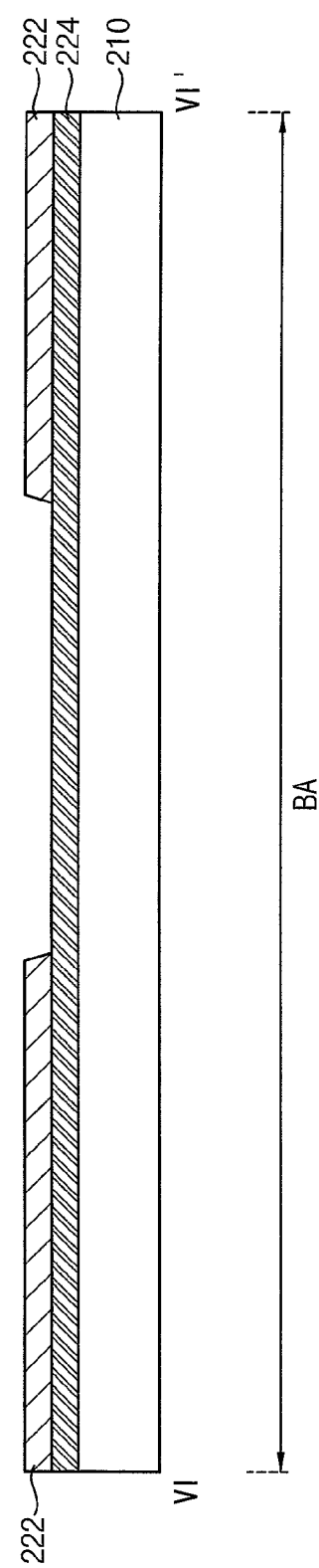

COLOR-CONVERTING SUBSTRATE INCLUDING SHARED LIGHT-EMITTING AREAS, DISPLAY DEVICE INCLUDING THE SAME AND METHOD FOR MANUFACTURING THE SAME

This application claims priority from and the benefit of Korean Patent Application No. 10-2019-0126016, filed on Oct. 11, 2019, which is incorporated by reference for all purposes as if fully set forth herein.

BACKGROUND

Field

Exemplary embodiments relate to a color-converting substrate, a display device including the color-converting substrate, and a method for manufacturing the color-converting substrate.

Discussion of the Background

An organic light-emitting display device is a self-emission display device, which is capable of generating a color image without an additional light source, such as a backlight.

Recently, organic light-emitting display devices including a color filter and a color-converting layer are being developed for improving a display quality. The color-converting layer may change a wavelength of light generated by a light-emitting element. Thus, the color-converting layer may output light having a color different from an incident light. For example, the color-converting layer may include a wavelength-converting material, such as a quantum dot.

An inkjet printing method may be generally used for forming the color-converting layer including the quantum dot. However, when the color-converting layer is formed by an inkjet printing method, a thickness of the color-converting layer may be irregular by distribution of ink drops due to an inkjet printing apparatus.

The above information disclosed in this Background section is only for understanding of the background of the inventive concepts, and, therefore, it may contain information that does not constitute prior art.

SUMMARY

Color-converting substrates constructed according to exemplary embodiments of the invention are capable of providing a color-converting layer with improved thickness uniformity.

Exemplary embodiments provide a display device including the color-converting substrate, which may improve an image quality.

Exemplary embodiments also provide a method for manufacturing the color-converting substrate.

Additional features of the inventive concepts will be set forth in the description which follows, and in part will be apparent from the description, or may be learned by practice of the inventive concepts.

A color-converting substrate according to an exemplary embodiment includes light-emitting areas and a light blocking area surrounding the light-emitting areas, the light-emitting areas including first light-emitting areas configured to emit a first color light, a partition wall including a first opening continuously overlapping the first light-emitting areas and a first portion of the light-blocking area disposed between the first light-emitting areas, a first color-converting layer including a wavelength-converting material and disposed in the first opening to overlap the first light-emitting areas and the first portion of the light-blocking area, and a color filter layer including a portion configured to block the first color light, the color filter layer overlapping the first color-converting layer and the first portion of the light-blocking area.

The light-emitting areas may further include second light-emitting areas configured to emit a second color light different from the first color light, and the color filter layer may include a first color filter overlapping the first light-emitting areas and configured to transmit the first color light, and a second color filter overlapping the second light-emitting areas and the first portion of the light-blocking area and configured to transmit the second color light.

The first color filter may further overlap a second portion of the light-blocking area disposed between the second light-emitting areas.

The color-converting substrate may further include a compensation layer overlapping the second light-emitting areas and the second portion of the light-blocking area, and configured to transmit an incident light without changing a wavelength of the incident light.

The light-emitting areas may further include third light-emitting areas configured to emit a third color light different from the first color light and the second color light, and the color filter layer may further include a third color filter overlapping the third light-emitting areas and configured to transmit the third color light, and a second color-converting layer including a wavelength-converting material and overlapping the third light-emitting areas and a third portion of the light-blocking area disposed between the third light-emitting areas.

The first color light may be a red light, the second color light may be a blue light, and the third color light may be a green light.

The second color filter may further overlap the third portion of the light-blocking area.

The third color filter may further overlap the third portion of the light-blocking area.

The partition wall may further include a second opening in which the compensation layer is disposed, and the first opening and the second opening may have different sizes.

The first color filter may include a plurality of patterns spaced apart from each other and overlapping the first light-emitting areas, respectively.

The wavelength-converting material may include a quantum dot.

A method for manufacturing a display device according to another exemplary embodiment includes forming a first color filter transmitting a first color light on a base substrate to overlap first light-emitting areas, forming a second color filter transmitting a second color light different from the first color light to overlap second light-emitting areas and a first portion of a light-blocking area disposed between the first light-emitting areas, forming a partition wall including a first opening continuously overlapping the first light-emitting areas and the first is portion of the light-blocking area, providing a first composition including a wavelength-converting material in the first opening, and curing the first composition to form a first color-converting layer.

The wavelength-converting material may include a quantum dot.

The first composition may be provided in the first opening as ink drops by an inkjet printing apparatus.

A display device according to still another exemplary embodiment includes a first substrate including an array of pixels, a second substrate combined with the first substrate and including light-emitting areas and a light-blocking area, the light-emitting areas including first light-emitting areas configured to emit a first color light and second light-emitting areas configured to emit a second color light different from the first color light, in which the second substrate further includes a partition wall including a first opening continuously overlapping the first light-emitting areas and a first portion of the light-blocking area disposed between the first light-emitting areas, a first color-converting layer including a wavelength-converting material and disposed in the first opening to overlap the first light-emitting areas and the first portion of the light-blocking area, a first color filter overlapping the first light-emitting areas and configured to transmit the first color light, and a second color filter overlapping the second light-emitting areas and the first portion of the light-blocking area and configured to transmit the second color light.

The first color filter may further overlap a second portion of the light-blocking area disposed between the second light-emitting areas.

The second substrate may further include a compensation layer overlapping the second light-emitting areas and the second portion of the light-blocking area, and configured to transmit an incident light without changing a wavelength of the incident light.

The light-emitting areas may further include third light-emitting areas configured to emit a third different from the first color light and the second color light, and the second substrate may further include a third color filter overlapping the third light-emitting areas and configured to transmit the third color light, and a second color-converting layer including a wavelength-converting material and overlapping the third light-emitting areas and a third portion of the light-blocking area disposed between the third light-emitting areas.

The first color light may be a red light, the second color light may be a blue light, and the third color light may be a green light.

The second color filter may further overlap the third portion of the light-blocking area.

The first color filter may include a plurality of patterns spaced apart from each other and overlapping the first light-emitting areas, respectively.

The wavelength-converting material may include a quantum dot.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIGS. 6B, 7B, 8B, and 9B are cross-sectional views taken along line V-V' of FIGS. 6A, 7A, 8A, and 9A, respectively.

FIGS. 6C, 7C, 8C, and 9C are cross-sectional views taken along line VI-VI' of FIGS. 6A, 7A, 8A, and 9A, respectively.

DETAILED DESCRIPTION

Figure 1:
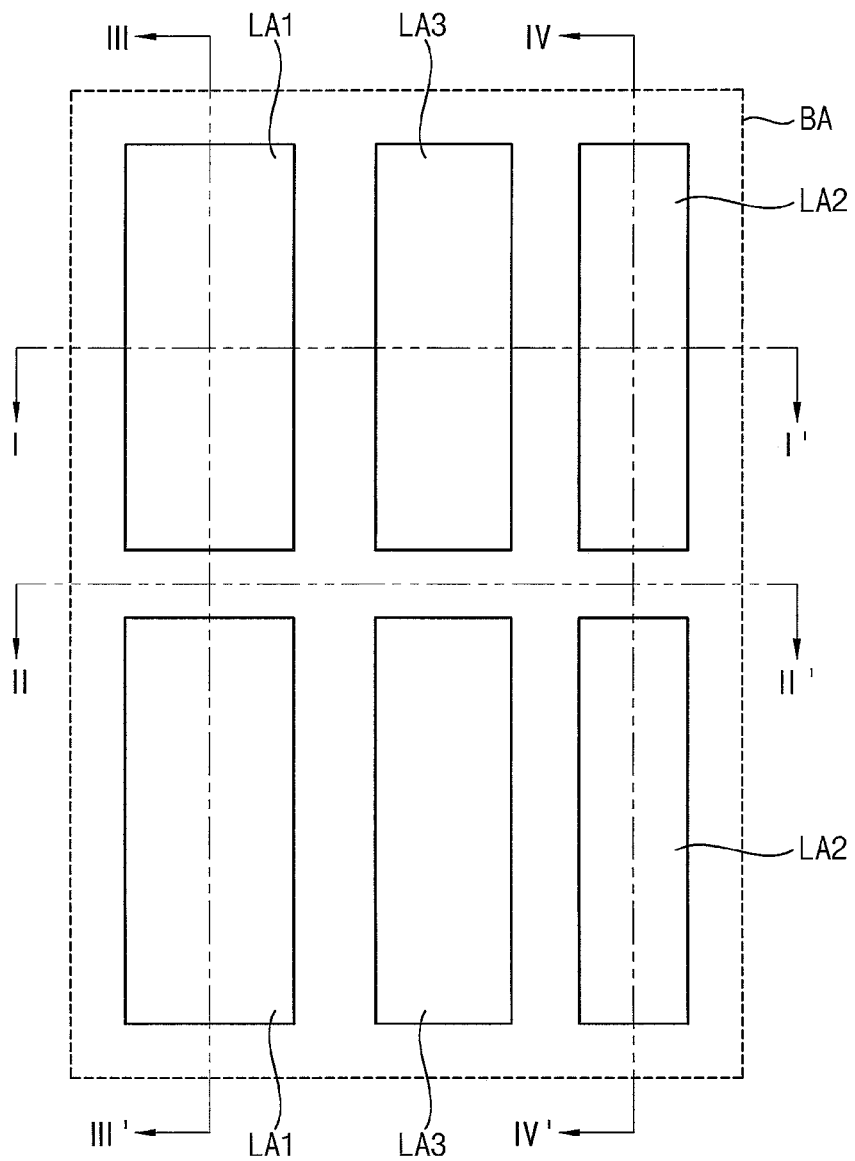
FIG. 1 is a plan view illustrating a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z- axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A color-converting substrate, a display device, and a method for manufacturing a color-converting substrate according to exemplary embodiments of the invention will be described hereinafter with reference to the accompanying drawings, in which some exemplary embodiments are shown. Same or similar reference numerals may be used for same or similar elements in the drawings.

Figure 2:
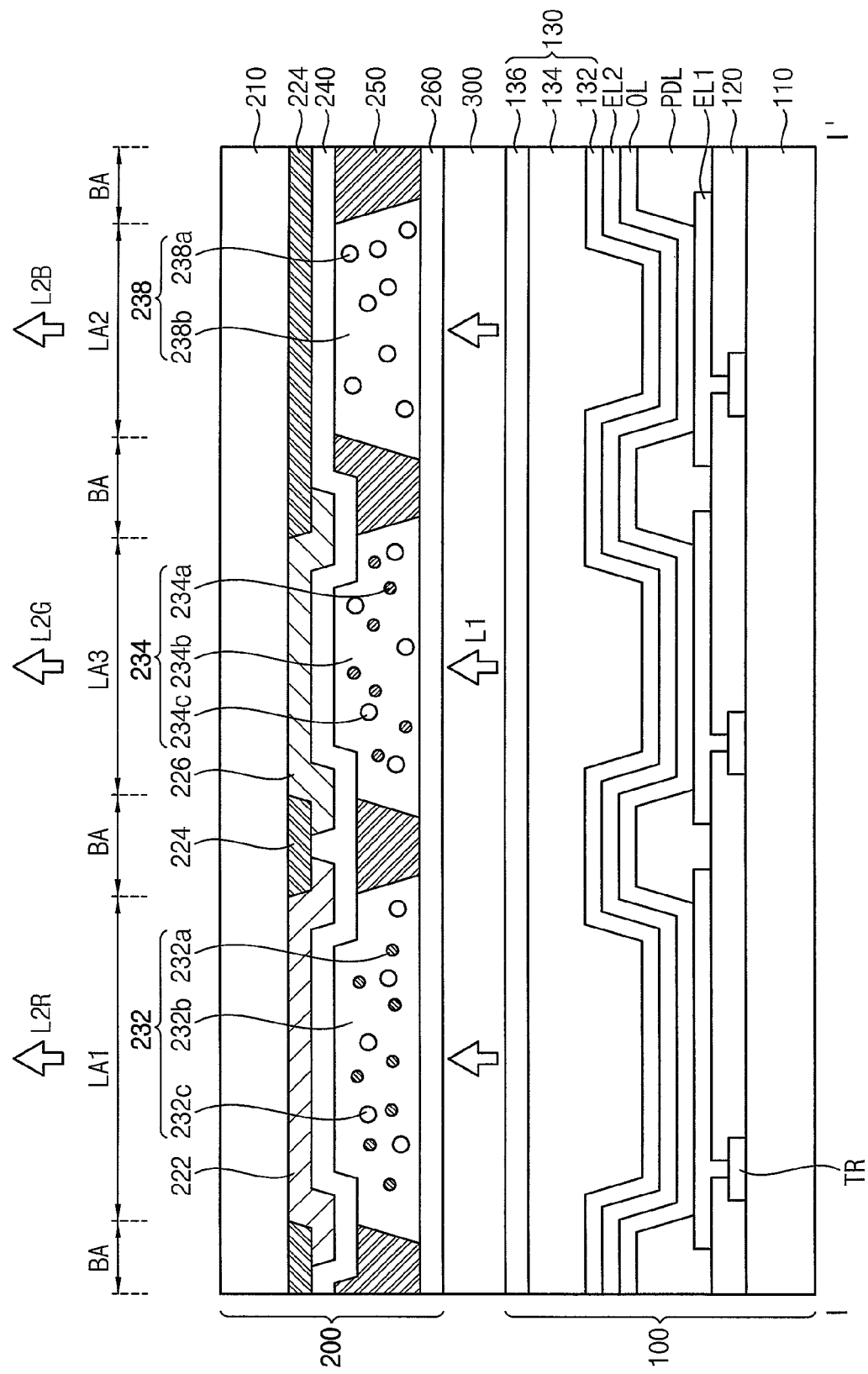
FIG. 2 is a cross-sectional view taken along line I-I' of FIG. 1.

FIG. 1 is a plan view illustrating a display device according to an exemplary embodiment. FIG. 2 is a cross-sectional view taken along line I-I' of FIG. 1.

Referring to FIGS. 1 and 2, a display device according to an exemplary embodiment includes a first substrate 100 and a second substrate 200. The first substrate 100 includes an array of pixels. Each pixel may include a light-emitting element generating light in response to a driving signal.

The second substrate 200 includes a color-converting layer changing a wavelength of light generated by the light-emitting element. Furthermore, the second substrate 200 includes a color filter transmitting light having a specific color.

Referring to FIG. 1, the display device may include a display area generating an image and a peripheral area surrounding the display area. The display area may include a light-emitting area emitting light and a light-blocking area BA surrounding the light-emitting area. Light generated in the display device may exit outwardly through the light-emitting area.

The light-emitting area may emit light having different colors. For example, the display device may include a first light-emitting area LA1 emitting a first color light, a second light-emitting area LA2 emitting a second color light, and a third light-emitting area LA3 emitting a third color light.

In an exemplary embodiment, light-emitting areas emitting light having the same color may be arranged along a first direction D1, and light-emitting areas emitting light having different colors may be arranged along a second direction D2 crossing the first direction D1. For example, the first direction D1 may be a column direction, and the second direction D2 may be a row direction.

For example, the first light-emitting area LA1, the second light-emitting area LA2, and the third light-emitting area LA3 may be arranged to have a same center line along a row direction. However, the inventive concepts are not limited thereto. For example, in some exemplary embodiments, the first light-emitting area LA1, the second light-emitting area LA2, and the third light-emitting area LA3 may be shifted from each other to have different center lines along a row direction.

In an exemplary embodiment, the first light-emitting area LA1 may emit a red light, the second light-emitting area LA2 may emit a blue light, and the third light-emitting area LA3 may emit a green light. However, the inventive concepts are not limited thereto. For example, in some exemplary embodiments, the light-emitting areas may be configured or combined to emit a yellow light, cyan light, and a magenta light.

Furthermore, in another exemplary embodiment, the light-emitting areas may emit at least four color lights. For example, light-emitting areas may be configured or combined to emit at least one of emit a yellow light, cyan light, and a magenta light in addition to a red light, a blue light and a green light. Furthermore, light-emitting areas may be configured or combined to further emit a white light.

In an exemplary embodiment, the light emitting areas may have substantially a rectangular shape, respectively. However, the inventive concepts are not limited thereto. For example, in some exemplary embodiments, the light emitting areas may have different shapes from each other. Furthermore, the light emitting areas may have various shapes, such as substantially a square shape, a rhombus shape, a triangular shape, a circular shape or the like. An edge or a corner of each light emitting area may have a round shape or may be chamfered.

In an exemplary embodiment, the light emitting areas may have different sizes from each other. For example, the first light-emitting area LA1 emitting a red light may have a larger size than the second light-emitting area LA2 emitting a blue light and the third light-emitting area LA3 emitting a green light. Furthermore, the third light-emitting area LA3 may have a larger size than the second light-emitting area LA2.

However, the inventive concepts are not limited thereto. For example, in some exemplary embodiments, the light emitting areas may have the same size.

Referring to FIG. 2, the first substrate 100 includes a driving element TR disposed on a base substrate 110. The driving element TR may be electrically connected to a corresponding light-emitting element. The light-emitting element may be an organic light-emitting diode, for example. According to an exemplary embodiment, the organic light-emitting diode may include a first electrode EL1, a second electrode EL2, and a light-emitting layer disposed OL between the first electrode EL1 and the second electrode EL2.

For example, the base substrate 110 may include glass, quartz, sapphire, a polymeric material or the like.

In an exemplary embodiment, the driving element TR may include a thin film transistor. The driving element TR may include a plurality of thin film transistors.

For example, a channel layer of the thin film transistor may include amorphous silicon, multi-crystalline silicon (polysilicon), or a metal oxide. For example, the metal oxide may be a two-component compound $(AB_x)$, ternary compound $(AB_xC_y)$, or four-component compound $(AB_xC_yD_z)$, which may include indium (In), zinc (Zn), gallium (Ga), tin (Sn), titanium (Ti), aluminum (Al), hafnium (Hf), zirconium (Zr), magnesium (Mg). For example, the metal oxide may include zinc oxide $(ZnO_x)$, gallium oxide $(GaO_x)$, titanium oxide $(TiO_x)$, tin oxide $(SnO_x)$, indium oxide $(InO_x)$, indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide $(ZnZr_xO_y)$, indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO) or the like.

The driving element TR may be covered by an insulation structure 120. The insulation structure 120 may include a combination of an inorganic insulation layer and an organic insulation layer.

The first electrode EL1 may function as an anode. For example, the first electrode EL1 may be formed as a transmitting electrode or a reflecting electrode according to an emission type of the display device (e.g., a front emission type or a rear emission type). When the first electrode EL1 is a reflecting electrode, the first electrode EL1 may include gold (Au), silver (Ag), aluminum (Al), copper (Cu), nickel (Ni), platinum (Pt), magnesium (Mg), chromium (Cr), tungsten (W), molybdenum (Mo), titanium (Ti) or a combination thereof, and may have a stacked structure further including a metal oxide layer including indium tin oxide, indium zinc oxide, zinc tin oxide, indium oxide, zinc oxide, tin oxide or the like.

The pixel-defining layer PDL is disposed on the insulation structure 120, and has an opening overlapping at least a portion of the first electrode EL1. For example, the pixel-defining layer PDL may include an organic insulating material. At least a portion of the light-emitting layer OL may be disposed in the opening of the pixel-defining layer PDL. In an exemplary embodiment, the light-emitting layer OL may extend continuously over a plurality of pixels in the display area. In another exemplary embodiment, the light-emitting layer OL may be formed as a pattern separated from a light-emitting layer of an adjacent pixel.

The light-emitting layer OL may include at least an organic light-emitting layer, and may further include at least one of a hole injection layer (HIL), a hole transporting layer (HTL), an electron transporting layer (ETL), and an electron injection layer (EIL). For example, the light-emitting layer OL may include a low molecular weight organic compound or a high molecular weight organic compound.

In an exemplary embodiment, the light-emitting layer OL may generate a blue light. However, the inventive concepts are not limited thereto. For example, in some exemplary embodiments, the light-emitting layer OL may generate a red light, a green light or the like. In another exemplary embodiment, the light-emitting layer OL may generate light having different colors in different pixels.

The second electrode EL2 may be formed as a transmitting electrode or a reflecting electrode according to an emission type of the display device. For example, the second electrode EL2 may include metal, a metal alloy, a metal nitride, a metal fluoride, a conductive metal oxide or a combination thereof. For example, the second electrode EL2 may be formed as a common layer extending continuously over a plurality of pixels in the display area.

The first substrate 100 may further include an encapsulation layer 130 covering light-emitting elements. The encapsulation layer 130 may extend cover an entire portion of the display area.

For example, the encapsulation layer 130 may have a stacked structure of an inorganic thin film and an organic thin film. As illustrated in FIG. 2, the encapsulation layer 130 according to an exemplary embodiment may include a first inorganic thin film 132, an organic thin film 134 disposed on the first inorganic thin film 132, and a second inorganic thin film 136 disposed on the organic thin film 134. However, the inventive concepts are not limited thereto. For example, in some exemplary embodiments, the encapsulation layer 130 may have a structure including at least two organic thin films and at least three inorganic thin films.

For example, the organic thin film 134 may include a cured resin, such as polyacrylate or the like. For example, the cured resin may be formed from cross-linking reaction of monomers. For example, the inorganic thin films 132 and 136 may include an inorganic material, such as silicon oxide, silicon nitride, silicon carbide, aluminum oxide, tantalum oxide, hafnium oxide, zirconium oxide, titanium oxide or the like.

The second substrate 200 includes a color-converting layer. The color-converting layer changes a wavelength of light L1 generated by the light-emitting element of the first substrate 100, and emits light having a color different from the incident light L1. Furthermore, the second substrate 200 includes a color filter layer overlapping the color-converting layer.

The color filter layer may be disposed between a base substrate 210 and the color-converting layer. The color filter layer filters light passing through the color filter to transmit light having a specific color.

In an exemplary embodiment, the color filter layer may include a first color filter 222, a second color filter 224, and a third color filter 226. The color filters may overlap a corresponding light-emitting area. Thus, a color of lights L2R, L2B, L2G exiting from the light-emitting areas may be determined by the color filters.

In an exemplary embodiment, the first color filter 222 overlaps the first light-emitting area LA1. For example, the first color filter 222 may selectively transmit a red light. The second color filter 224 overlaps the second light-emitting area LA2. For example, the second color filter 224 may selectively transmit a blue light. The third color filter 226 overlaps the third light-emitting area LA3. For example, the third color filter 226 may selectively transmit a green light.

The second color filter 224 may include a transmitting portion, which overlaps the second light-emitting area LA2, and a light-blocking portion overlapping the light-blocking area BA. In an exemplary embodiment, the light-blocking portion of the second color filter 224 may be formed to entirely overlap the light-blocking area BA. The light-blocking portion of the second color filter 224 may function as a light-blocking member blocking light having a different color from light transmitted by the second color filter 224.

In an exemplary embodiment, the second color filter 224 may have an opening corresponding to the first light-emitting area LA1 and the third light-emitting area LA3. The second color filter 224 may partially overlap the first color filter 222 and the third color filter 226.

The second substrate 200 may include a first protective layer 240 covering the color filter layer. The first protective layer 240 may include an inorganic material, such as silicon oxide, silicon nitride or the like.

The color-converting layer overlaps a corresponding light-emitting area. For example, the second substrate 200 may include a first color-converting layer 232 overlapping the first light-emitting area LA1.

The first color-converting layer 232 may include a wavelength-converting material 232a and a resin part 232b.

For example, the wavelength-converting material 232a may include a quantum dot. The quantum dot may be defined as a nano-crystalline semiconductor material. The quantum dot may absorb incident light and emit light having a wavelength different from that of the incident light. For example, the quantum dot may have a diameter equal to or less than about 100 nm. In an exemplary embodiment, the quantum dot may have a diameter of about 1 nm to about 20 nm.

For example, the quantum dot may include a II-VI group compound, a III-V group compound, a IV-VI group compound, a IV group element, a IV group compound or a combination thereof.

For example, the II-VI group compound may include a binary compound selected from CdSe, CdTe, ZnS, ZnSe, ZnTe, ZnO, HgS, HgSe, HgTe, MgSe, MgS and a combination thereof, a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and a combination thereof, or a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe and a combination thereof.

For example, the III-V group compound may include a binary compound selected from GaN, GaP, GaAs, GaSb, AlN, AlP, AlAs, AlSb, InN, InP, InAs, InSb and a combination thereof, a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP and a combination thereof, or a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and a combination thereof.

For example, the IV-VI group compound may include a binary compound selected from SnS, SnSe, SnTe, PbS, PbSe, PbTe and a combination thereof, a ternary compound selected from SnSeS, SnSeTe, SnSTe, PbSeS, PbSeTe, PbSTe, SnPbS, SnPbSe, SnPbTe and a combination thereof, or a quaternary compound selected from SnPbSSe, SnPbSeTe, SnPbSTe and a combination thereof.

For example, the IV group element may include Si, Ge or a combination thereof. The IV group compound may include a binary compound selected from SiC, SiGe and a combination thereof.

For example, the quantum dot may have a core-shell structure including a core and a shell which surrounds the core. In an exemplary embodiment, for example, the core and the shell may include different materials.

For example, the quantum dot may be dispersed in the resin part 232b. For example, the resin part 232b may include an epoxy resin, an acrylic resin, a phenolic resin, a melamine resin, a cardo resin, an imide resin or the like.

The first color-converting layer 232 may further include a scattering particle 232c. The scattering particle 232c may scatter incident light without substantially changing a wavelength of the incident light.

The scattering particle 232c may include a metal oxide or an inorganic material. For example, the metal oxide may include titanium oxide, zirconium oxide, aluminum oxide, indium oxide, zinc oxide, tin oxide or the like. For example, the organic material may include an acrylic resin, an urethane resin or the like.

For example, a light-emitting diode corresponding to the first light-emitting area LA1 may generate a blue light L1 having a peak in a range of about 440 nm to about 480 nm. The first color-converting layer 232 changes a wavelength of the blue light L1 incident thereon to emit a red light. A remainder of the blue light L1, which is not color-changed in the first color-converting layer 232, is blocked by the first color filter 222. As such, the first light-emitting area LA1 may selectively emit a red light L2R. For example, the red light L2R may have a peak in a range of about 610 nm to about 650 nm.

The second substrate 200 may further include a second color-converting layer 234 overlapping the third light-emitting area LA3. The second color-converting layer 234 may include a wavelength-converting material 234a and a resin part 234b.

For example, a light-emitting diode corresponding to the third light-emitting area LA3 may generate a blue light L1. The second color-converting layer 234 changes a wavelength of the blue light L1 incident thereon to emit a green light. A remainder of the blue light L1, which is not color-changed in the second color-converting layer 234, is blocked by the third color filter 226. As such, the third light-emitting area LA3 may selectively emit a green light L2G. For example, the green light L2G may have a peak in a range of about 510 nm to about 550 nm.

The second substrate 200 may further include a compensation layer 238 overlapping the second light-emitting area LA2. The compensation layer 238 may not include a wavelength-converting material. As such, the blue light L1 entering the compensation layer 238 may pass through the compensation layer 238 to enter the second color filter 224 without substantially changing a color thereof. As such, the second light-emitting area LA2 may emit a blue light L2B.

The compensation layer 238 may include a resin part 238b. For example, the resin part 238b may include substantially the same material as the resin parts 232b and 234b of the color-converting layers 232 and 234. The compensation layer 238 may further include a scattering particle 238a.

The second substrate 200 includes a partition wall 250 surrounding the color-converting layers 232 and 234 and the compensation layer 238. The partition wall 250 may form a space receiving an ink composition for forming the color-converting layers 232 and 234 and the compensation layer 238. As such, the partition wall 250 may have a grid shape or a matrix shape, in a plan view.

For example, the partition wall 250 may include an organic material, such as an epoxy resin, a phenolic resin, an acrylic resin, a silicone resin or the like.

In an exemplary embodiment, the partition wall 250 may include a light-blocking material to function as a black matrix. For example, at least a portion of the partition wall 250 may include a light-blocking material, such as a pigment, a dye, a carbon black or the like. For example, the partition wall 250 may overlap a portion of the light-blocking area BA.

The second substrate 200 may include a second protective layer 260 covering the color-converting layers 232 and 234, the compensation layer 238, and the partition wall 250. The second protective layer 260 may include an inorganic material, such as silicon oxide, silicon nitride or the like.

A filling member 300 may be disposed between the first substrate 100 and the second substrate 200. The filling member 300 may include an organic material, such as a silicone resin, an epoxy resin or the like. Furthermore, the filling member 300 may include an appropriate material for matching a refractive index.

Figure 3:
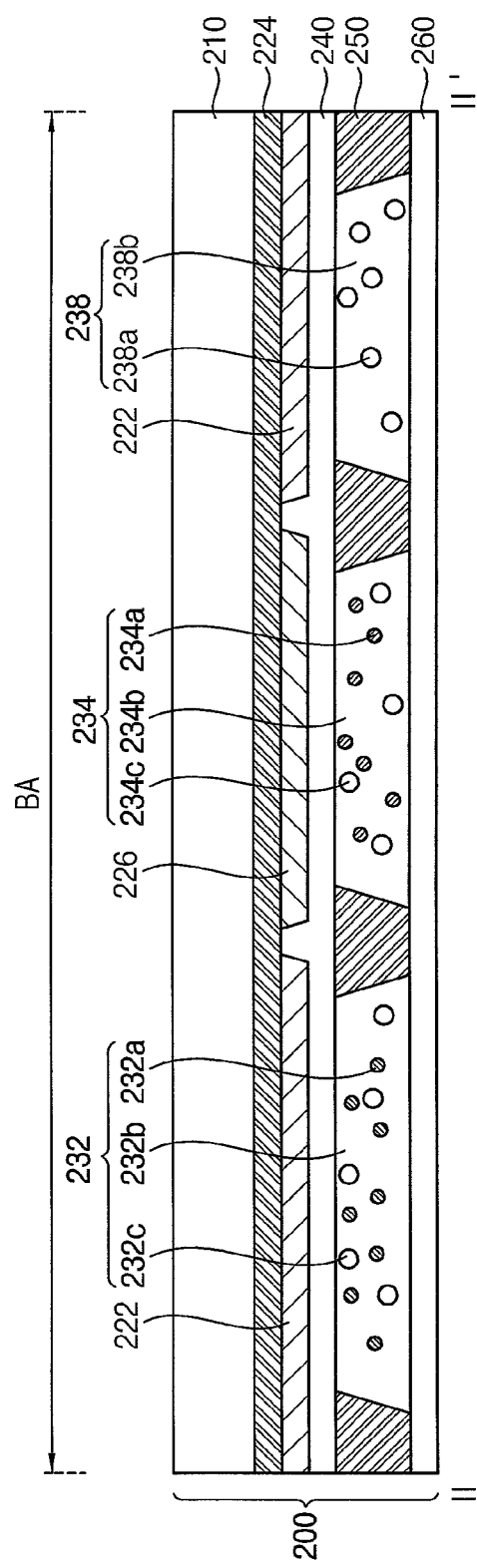
FIG. 3 is a cross-sectional view taken along line II-II' of FIG. 1.
Figure 4:
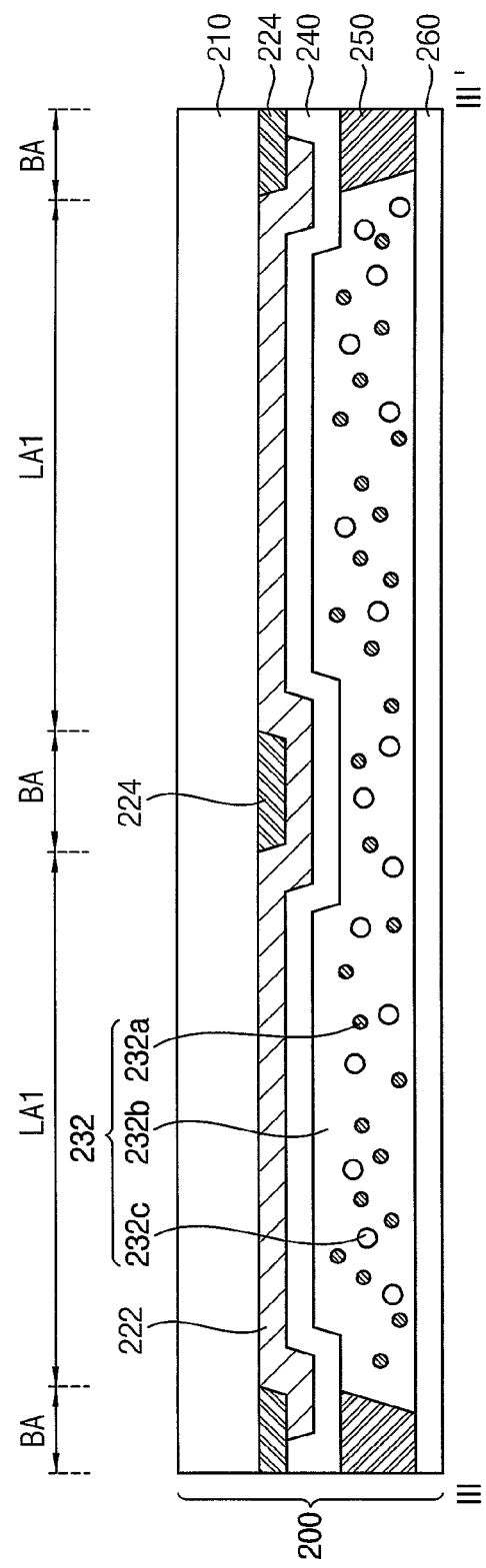
FIG. 4 is a cross-sectional view taken along line III-III' of FIG. 1.
Figure 5:
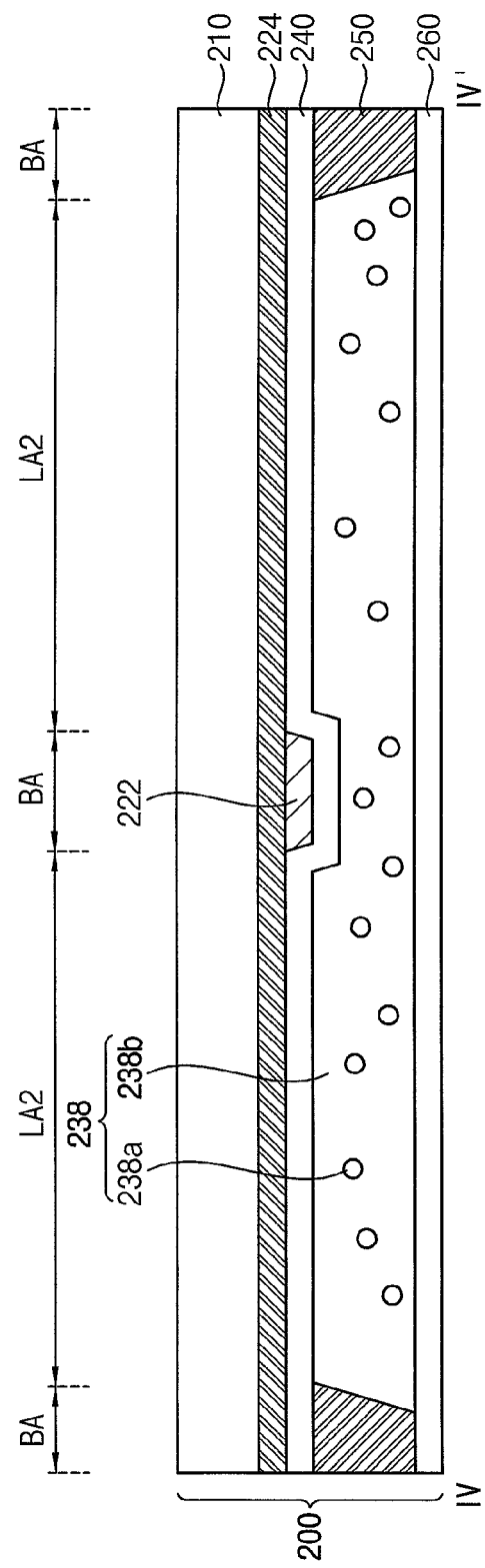
FIG. 5 is a cross-sectional view taken along line IV-IV' of FIG. 1.

FIG. 3 is a cross-sectional view taken along line II-II' of FIG. 1. FIG. 4 is a cross-sectional view taken along line III-III' of FIG. 1. FIG. 5 is a cross-sectional view taken along line IV-IV' of FIG. 1.

FIGS. 3, 4, and 5 illustrated a second substrate of a display device according to an exemplary embodiment. In particular, FIG. 3 illustrates a light-blocking area disposed between adjacent light-emitting areas emitting the same color light. FIGS. 4 and 5 illustrate adjacent light-emitting areas emitting the same color light and a light-blocking area BA disposed therebetween.

Referring to FIGS. 1, 3, and 4, first light-emitting areas LA1 emitting a red light may be spaced apart from each other along a first direction D1. A light-blocking area BA disposed between the adjacent first light-emitting areas LA1 may extend along a second direction D2.

The first color filter 222 may continuously overlap the adjacent first light-emitting areas LA1. However, the inventive concepts are not limited thereto. For example, in some exemplary embodiments, the first color filter 222 may include two separated patterns, which respectively overlap the adjacent first light-emitting areas LA1.

In an exemplary embodiment, the partition wall 250 is not disposed in the light-blocking area BA disposed between the adjacent first light-emitting areas LA1. As such, the first color-converting layer 232 may continuously overlap the adjacent first light-emitting areas LA1. More particularly, the first color-converting layer 232 may overlap the light-blocking area BA disposed between the adjacent first light-emitting areas LA1.

In an exemplary embodiment, the partition wall 250 is not disposed in the light-blocking area BA disposed between adjacent third light-emitting areas LA3. As such, the second color-converting layer 234 may continuously overlap the adjacent third light-emitting areas LA3. More particularly, the second color-converting layer 234 may overlap the light-blocking area BA disposed between the adjacent third light-emitting areas LA3.

In an exemplary embodiment, the light-blocking area BA disposed between the adjacent first light-emitting areas LA1 may overlap the second color filter 224. The second color filter 224 may extend to overlap the light-blocking area BA disposed between the adjacent third light-emitting areas LA3.

Referring to FIG. 5, the partition wall 250 is not disposed in the light-blocking area BA disposed between adjacent second light-emitting areas LA2. As such, the compensation layer 238 may continuously overlap the adjacent second light-emitting areas LA2. More particularly, the compensation layer 238 may overlap the light-blocking area BA disposed between the adjacent second light-emitting areas LA2.

In an exemplary embodiment, a portion of the first color filter 222 may overlap the light-blocking area BA disposed between the adjacent second light-emitting areas LA2.

For example, the first light-emitting areas LA1 emit a red light. The second color filter 224 disposed between the first light-emitting areas LA1 selectively transmits a blue light. In this manner, a red light generated from one first light-emitting area LA1 may be prevented from exiting through an adjacent first light-emitting area LA1.

For example, the second light-emitting areas LA2 emit a blue light. The first color filter 222 disposed between the second light-emitting areas LA2 selectively transmits a red light. In this manner, a blue light generated from one second light-emitting area LA2 may be prevented from exiting through an adjacent second light-emitting area LA2.

For example, the third light-emitting areas LA3 emit a green light. The second color filter 224 disposed between the third light-emitting areas LA3 selectively transmits a blue light. In this manner, a green light generated from a third light-emitting area LA3 may be prevented from exiting through an adjacent third light-emitting area LA3.

Figure 8A:
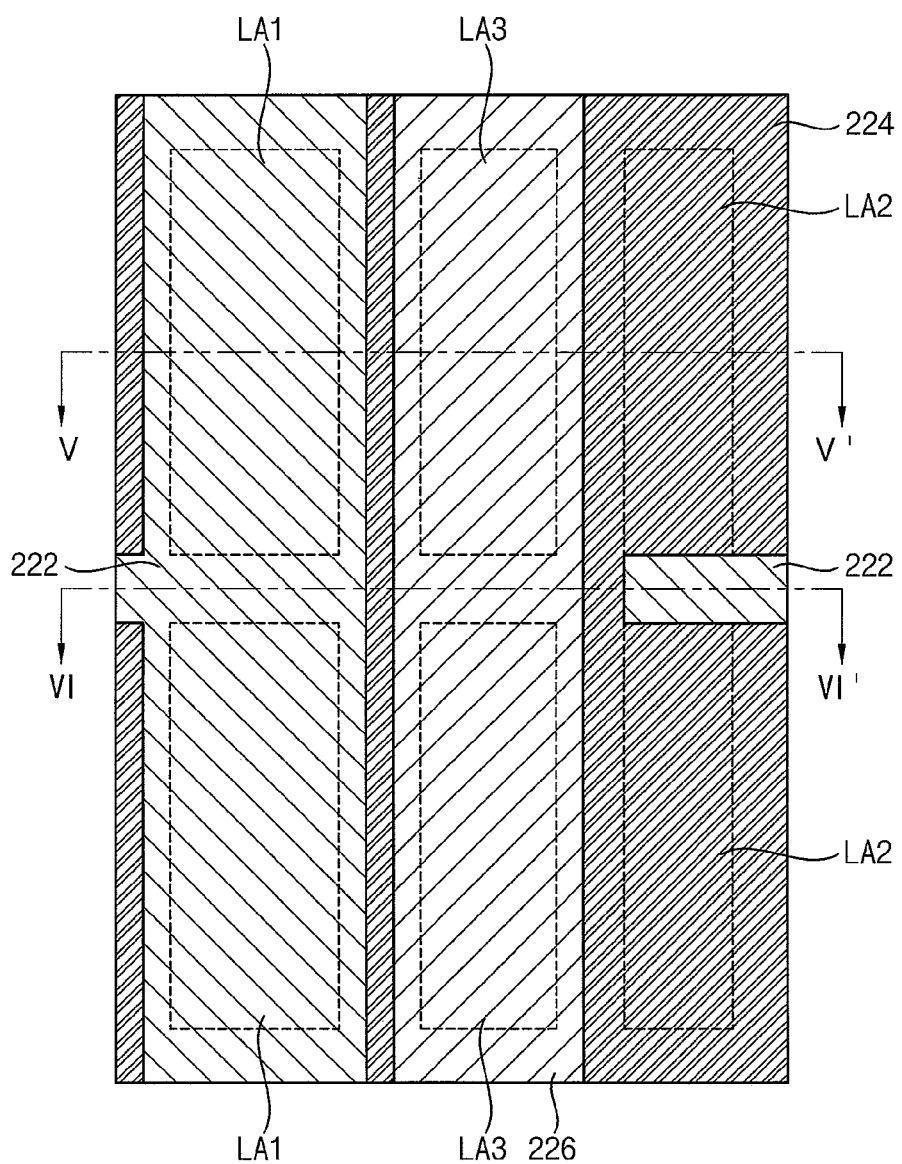
Figure 8B:
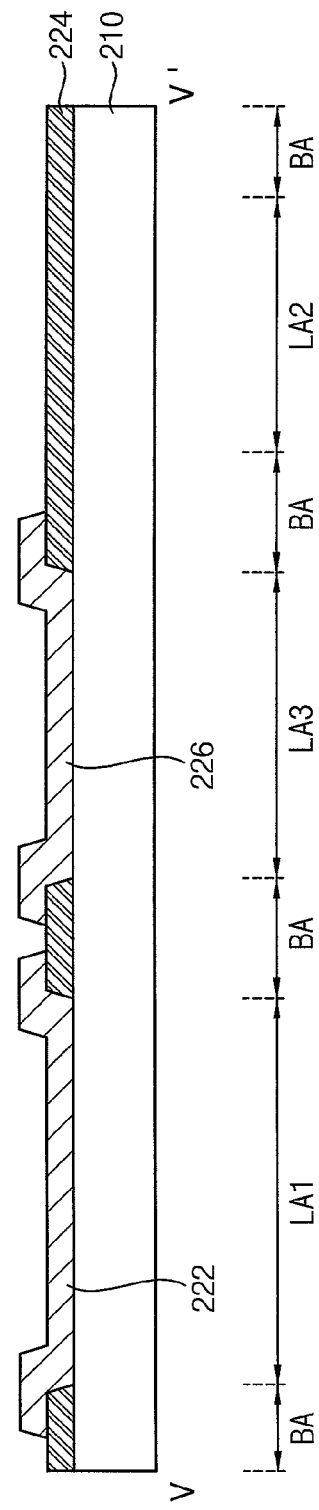
Figure 8C:
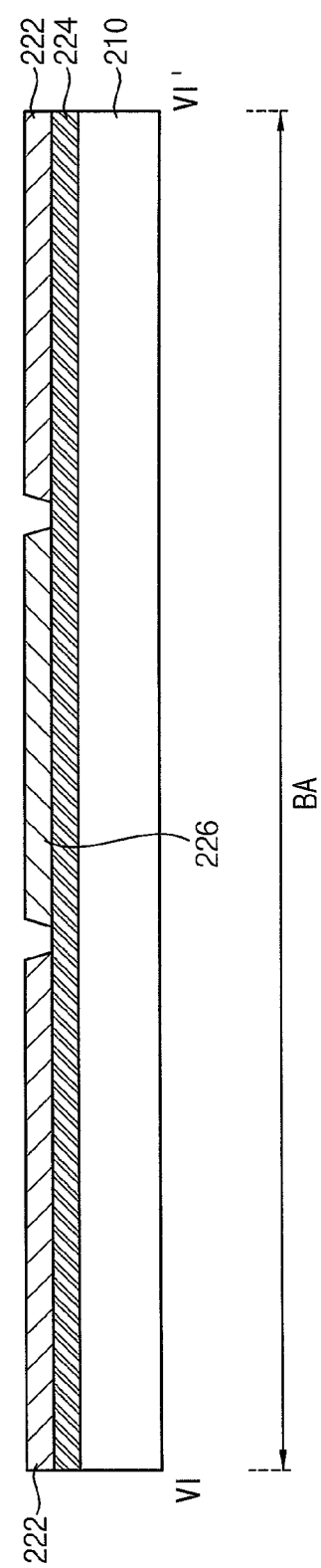
Figure 9A:
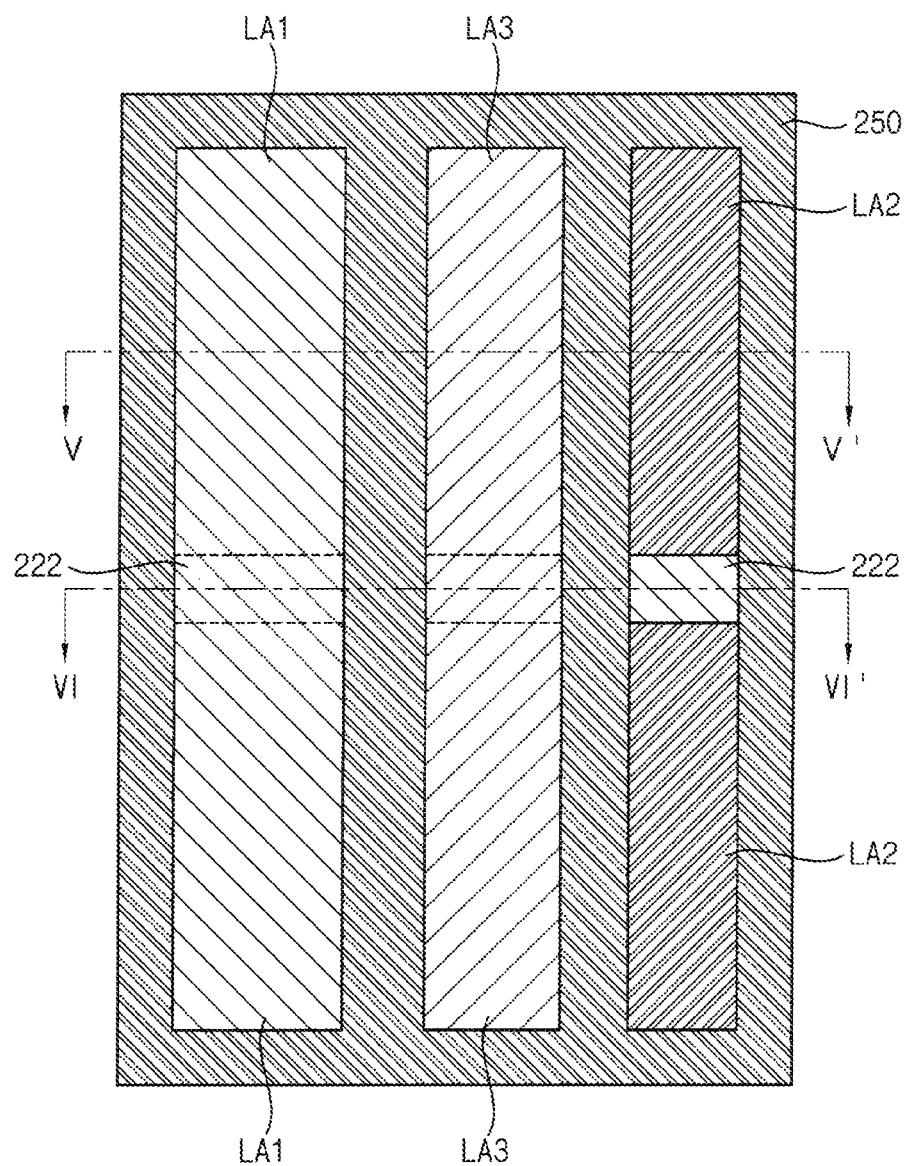
Figure 9B:
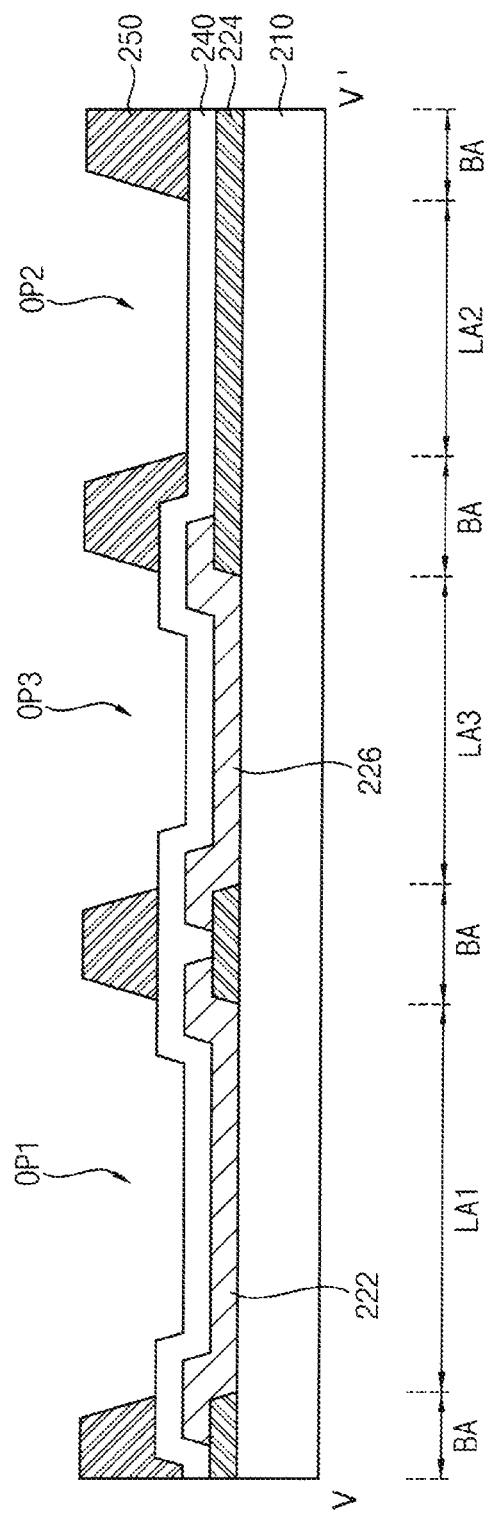
Figure 9C:
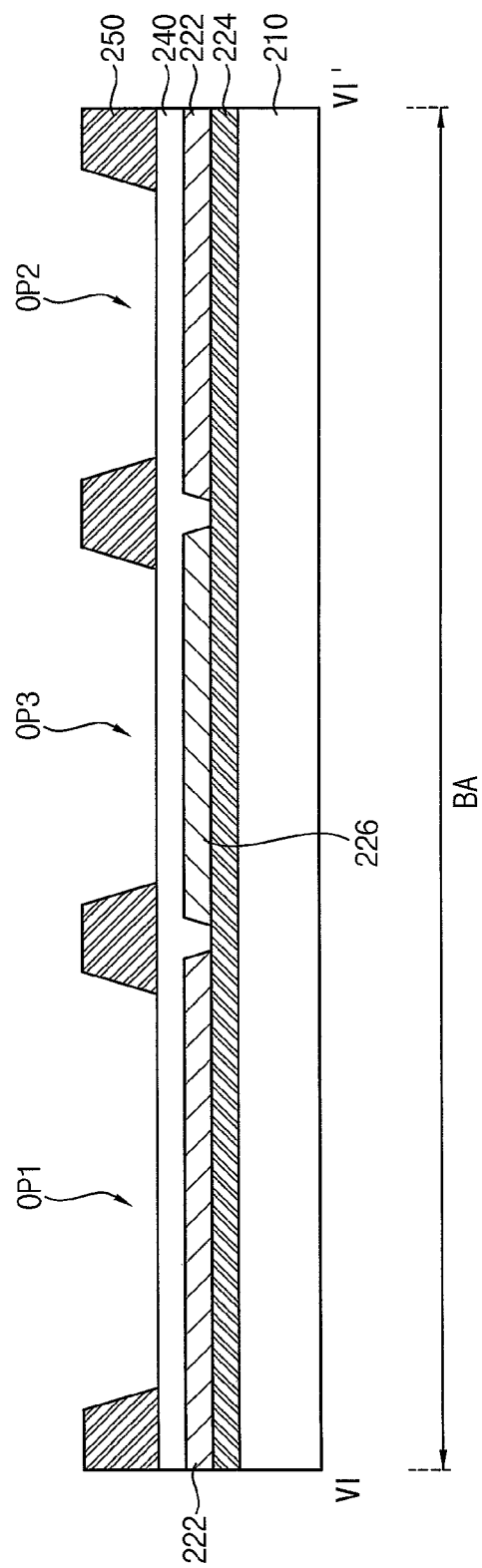
Figure 10A:
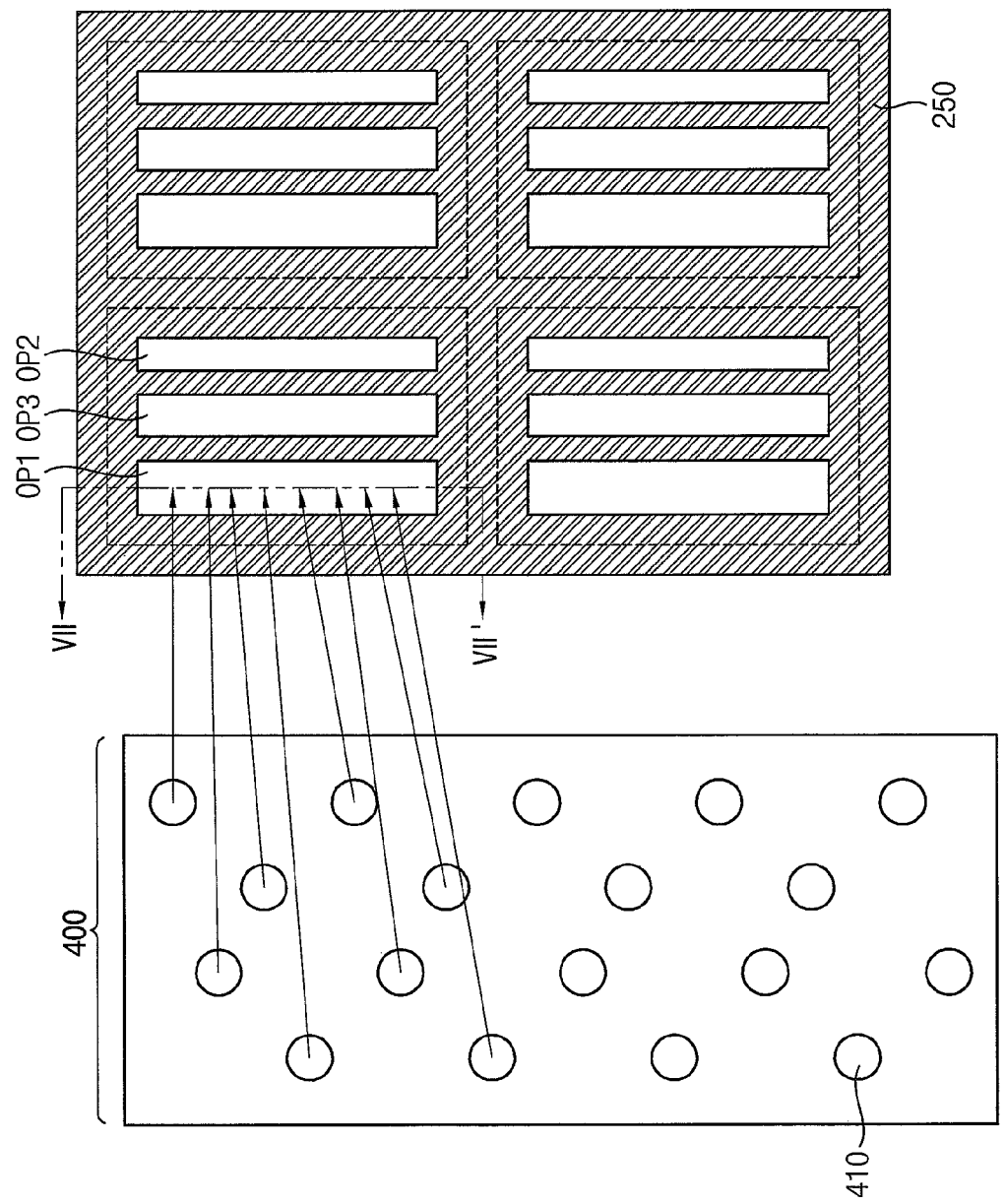
FIG. 10A is a plan view illustrating a step of dropping ink in a method for manufacturing a color-converting substrate according to an exemplary embodiment.
Figure 10B:
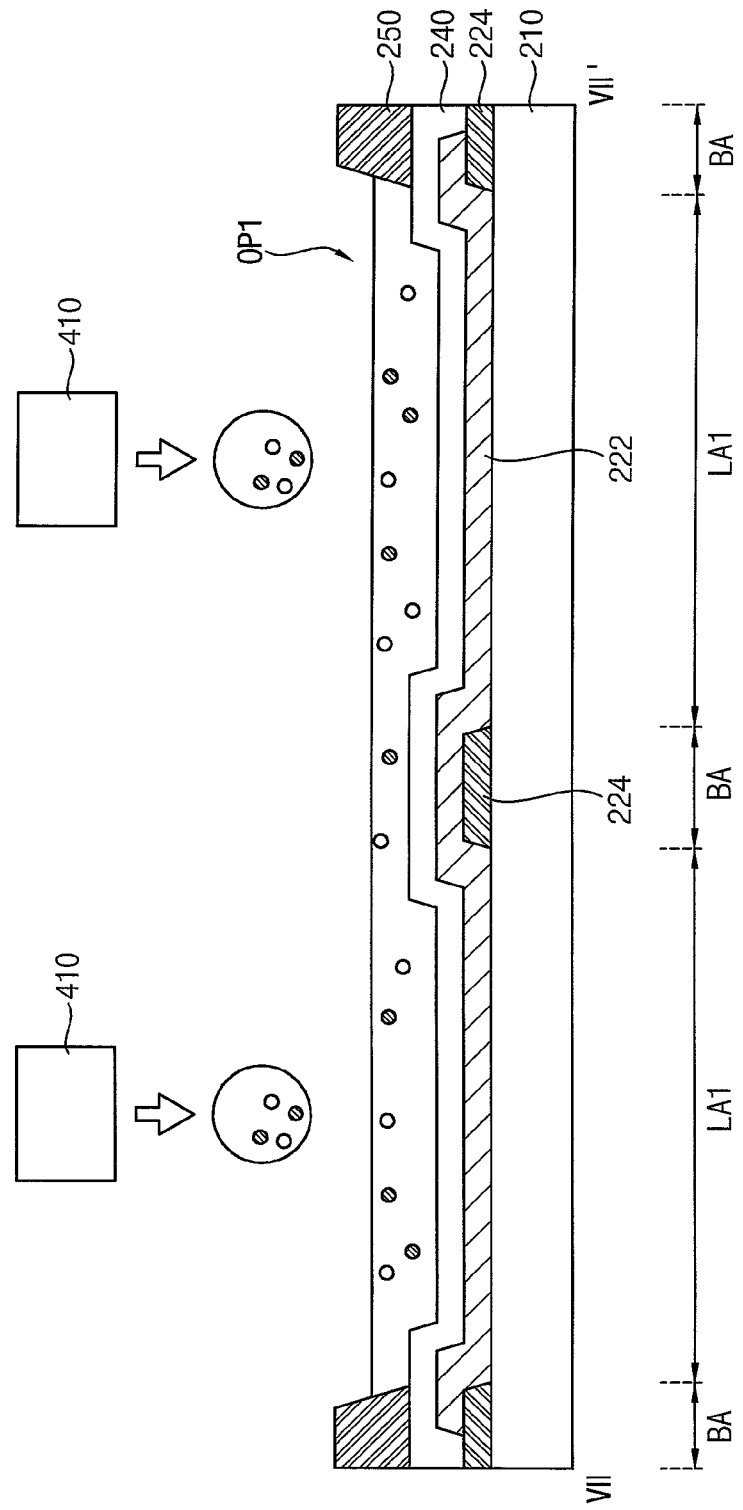
FIG. 10B is a cross-sectional view taken along line VII-VII' of FIG. 10A.

FIGS. 6A to 10B illustrate a method for manufacturing a color-converting substrate according to an exemplary embodiment. In particular, FIGS. 6A, 7A, 8A, and 9A are plan views illustrating a method for manufacturing a color-converting substrate according to an exemplary embodiment. FIGS. 6B, 7B, 8B, and 9B are cross-sectional views taken along line V-V' of FIGS. 6A, 7A, 8A, and 9A. FIGS. 6C, 7C, 8C, and 9C are cross-sectional views taken along line VI-VI' of FIGS. 6A, 7A, 8A, and 9A. FIG. 10A is a plan view illustrating a step of dropping ink in a method for manufacturing a color-converting substrate according to an exemplary embodiment. FIG. 10B is a cross-sectional view taken along line VII-VII' of FIG. 10A.

Figure 6A:
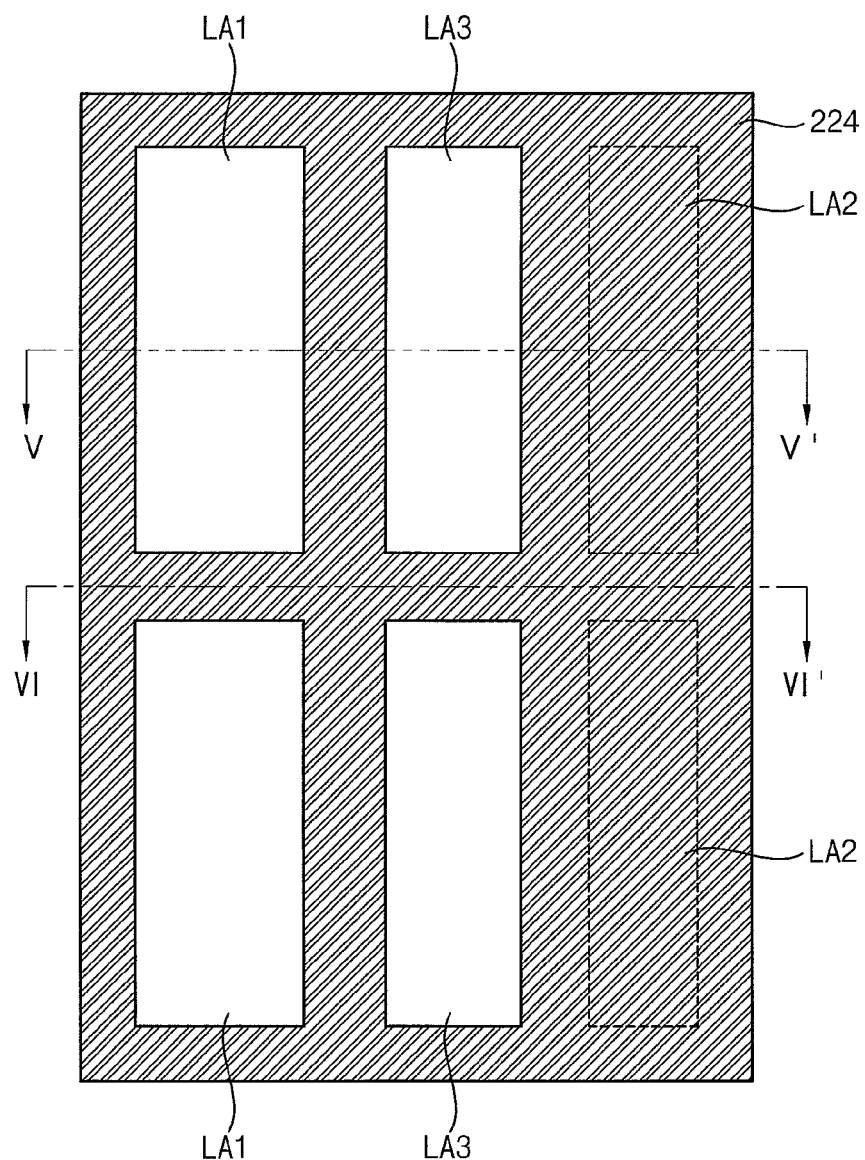
FIGS. 6A, 7A, 8A, and 9A are plan views illustrating a method for manufacturing a color-converting substrate according to an exemplary embodiment.
Figure 6B:
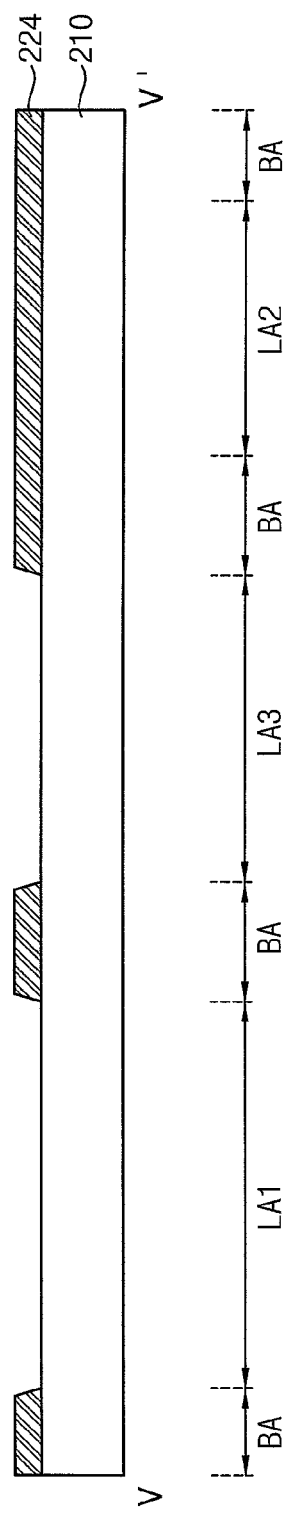
Figure 6C:
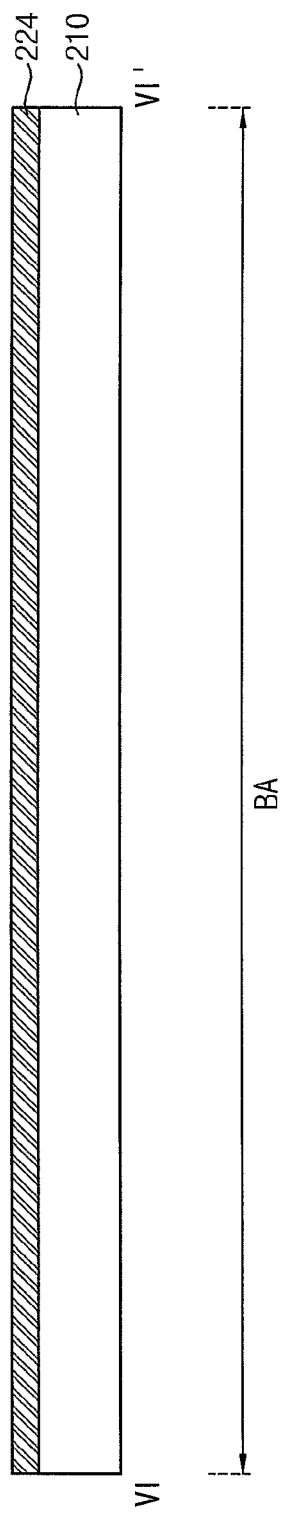

Referring to FIGS. 6A, 6B, and 6C, a second color filter 224 is formed on a base substrate 210. The second color filter 224 may overlap a second light-emitting area LA2. Furthermore, the second color filter 224 may overlap a light-blocking area BA adjacent to a first light-emitting area LA1 and a third light-emitting area LA3. Furthermore, the second color filter 224 may overlap the light-blocking area BA between adjacent first light-emitting areas LA1 and between adjacent third light-emitting areas LA3.

In an exemplary embodiment, the second color filter 224 may be a blue filter selectively transmitting a blue light. For example, the second color filter 224 may be formed from a color filter composition including a blue pigment and/or a blue dye.

Figure 7A:
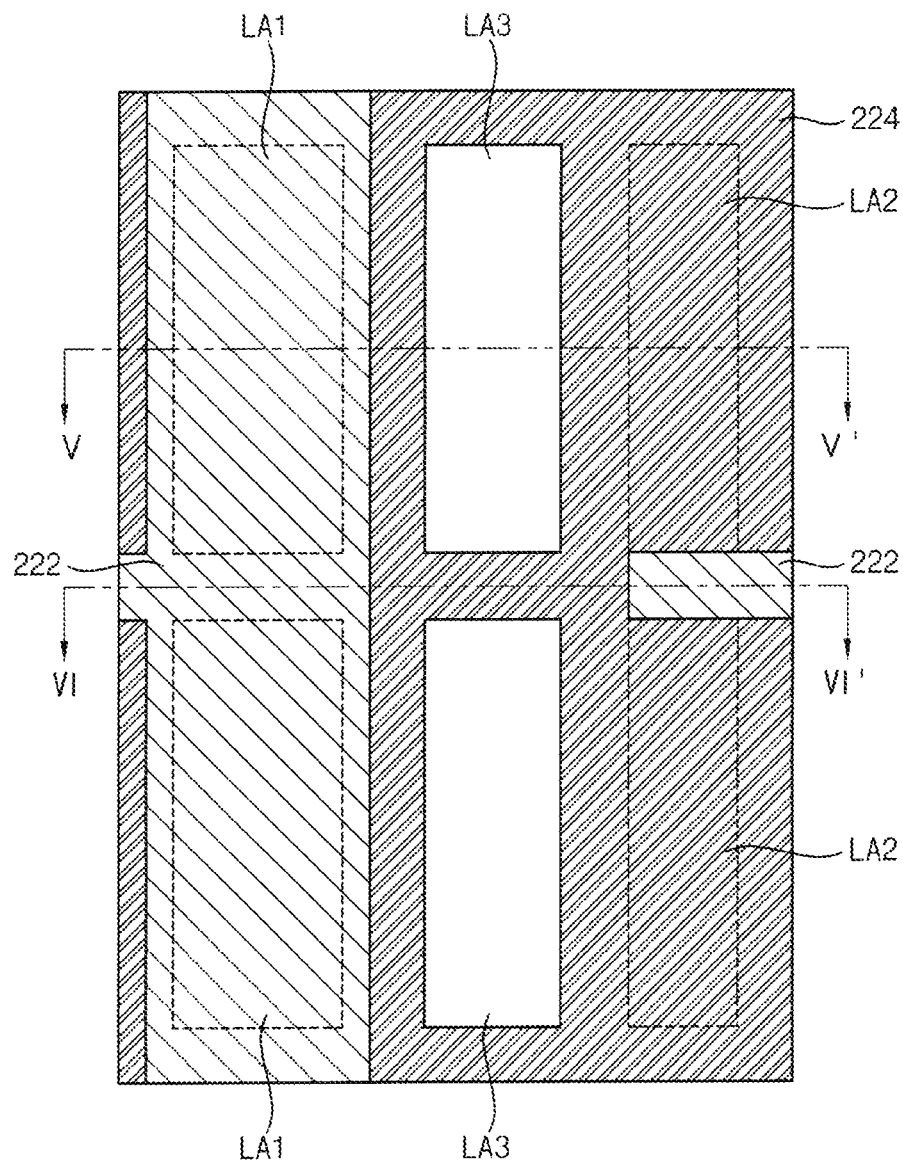

Referring to FIGS. 7A, 7B, and 7C, a first color filter 222 is formed on the base substrate 210 and the second color filter 224.

The first color filter 222 overlaps the first light-emitting areas LA1. Furthermore, the first color filter 222 may overlap the light-blocking area BA between adjacent second light-emitting areas LA2.

In an exemplary embodiment, the first color filter 222 may be a red filter selectively transmitting a red light. For example, the first color filter 222 may be formed from a color filter composition including a red pigment and/or a red dye.

Referring to FIGS. 8A, 8B, and 8C, a third color filter 226 is formed on the base substrate 210 and the second color filter 224.

The third color filter 226 overlaps the third light-emitting areas LA3.

In an exemplary embodiment, the third color filter 226 may be a green filter selectively transmitting a green light. For example, the third color filter 226 may be formed from a color filter composition including a green pigment and/or a green dye.

In exemplary embodiments, an order of forming the color filters and position thereof are not limited to those shown in FIG. 6A to 8C. For example, in some exemplary embodiments, the first color filter 222 or the third color filter 226 may be formed prior to the second color filter 224, so that the first color filter 222 or the third color filter 226 may be disposed between the second color filter 224 and the base substrate 210.

Referring to FIGS. 9A, 9B, and 9C, a first protective layer 240 is formed to cover the color filter layer. A partition wall 250 is formed on the first protective layer 240. In some exemplary embodiments, the first protective layer 240 may be omitted. In FIG. 9A, the first protective layer 240 is not shown to illustrate the configuration underlying the first protective layer 240.

The partition wall 250 may overlap the light-blocking area BA between light-emitting areas emitting different color lights. The partition wall 250 may include an opening overlapping the light-emitting areas.

For example, the partition wall 250 may include a first opening OP1 overlapping adjacent first light-emitting areas LA1, a second opening OP2 overlapping adjacent second light-emitting areas LA2, and a third opening OP3 overlapping adjacent third light-emitting areas LA3.

In an exemplary embodiment, the first opening OP1 may have a shape extending along the first direction D1 to continuously overlap the adjacent first light-emitting areas LA1 and the light-blocking area BA between the adjacent first light-emitting areas LA1. The second opening OP2 may have a shape extending along the first direction D1 to continuously overlap the adjacent second light-emitting areas LA2 and the light-blocking area BA between the adjacent second light-emitting areas LA2. The third opening OP3 may have a shape extending along the first direction D1 to continuously overlap the adjacent third light-emitting areas LA3 and the light-blocking area BA between the adjacent third light-emitting areas LA3.

Referring to FIGS. 10A and 10B, an ink including a wavelength-converting material is provided in the openings of the partition wall 250.

For example, an inkjet printing apparatus may be used for dropping the ink. The inkjet printing apparatus may include a head 400 including a plurality of nozzles 410.

The inkjet printing apparatus may provide a composition in the openings OP1, OP2, and OP3 of the partition wall 250 through the nozzle 410 of the head 400. For example, the inkjet printing apparatus may include a first head providing a first composition in the first opening OP1, a second head providing a second composition in the second opening OP2, and a third head providing a third composition in the third opening OP3, In an exemplary embodiment, the first and third compositions may include a wavelength-converting material. For example, the first and third compositions may include a wavelength-converting material, a binder component, and a solvent.

For example, the wavelength-converting material may include a quantum dot. In an exemplary embodiment, the first composition may include a quantum dot capable of emitting a red light, and the third composition may include a quantum dot capable of emitting a green light. The quantum dots may include an organic ligand combined with a surface thereof.

The binder component may include a polymer, a polymerizable monomer or a combination thereof. For example, the polymer may include an aromatic ring structure in a main chain thereof. For example, the aromatic ring structure may include a phenylene group, a biphenylene group, a fluorene or the like. The polymerizable monomer may contain at least one double bond between carbon atoms. For example, the polymerizable monomer may include a (meth)acrylate compound.

The solvent may be properly selected or combined from known materials in view of compatability with other components, dispersion of a quantum dot, a viscosity, a boiling point or the like.

In some exemplary embodiments, the first and third compositions may further include a scattering particle, a photo-initiator, a polymer stabilizer, a leveling agent, a coupling agent or a combination thereof.

The second composition may include the same material as the first and third compositions, except for excluding the wavelength-converting material. For example, the second composition may include a binder component and a solvent, and may further include a scattering particle, a photo-initiator, a polymer stabilizer, a leveling agent, a coupling agent or a combination thereof.

The inkjet printing apparatus provide ink drops including a corresponding composition in the openings OP1, OP2 and OP3. As such, the openings OP1, OP2 and OP3 may be filled with the corresponding composition.

The number of the ink drops provided in the openings OP1, OP2 and OP3 may be determined by a total volume of an opening and a volume of a single ink drop. In an exemplary embodiment, the ink drops provided in the openings OP1, OP2 and OP3 may be output by the nozzles 410. For example, the ink drops provided in the openings OP1, OP2 and OP3 may be output by different nozzles 410.

The compositions provided in the openings OP1, OP2 and OP3 may be cured to form a color-converting layer and a compensation layer. For example, the compositions may be cured by heat and light.

The nozzles 410 of the inkjet printing apparatus may be set to output ink drops having a predetermined volume. However, an actual volume of the ink drops may be different from the predetermined volume. Thus, the ink drops may have volume distribution. In this case, the color-converting layer and the compensation layer may have a thickness distribution, which may deteriorate display quality.

According to exemplary embodiments, a partition wall is not disposed in a light-blocking area between adjacent light-emitting areas emitting the same light. As such, the total number of ink drops provided in each opening of the partition wall may be increased. For example, the total number of ink drops provided in the expanded opening commonly overlapping a plurality of light-emitting areas may be more than twice the total number of ink drops provided in an opening overlapping only a single light-emitting area. In this manner, volume distribution of the ink drops may be reduced. Accordingly, the color-converting layer and the compensation layer formed in the expanded opening according to an exemplary embodiment may have a is reduced thickness distribution.

Furthermore, a color filter having a different color from an output light of an adjacent light-emitting area is disposed in the light-blocking area where the partition wall is removed. As such, deterioration of a display quality due to light leakage may be prevented.

Figure 11:
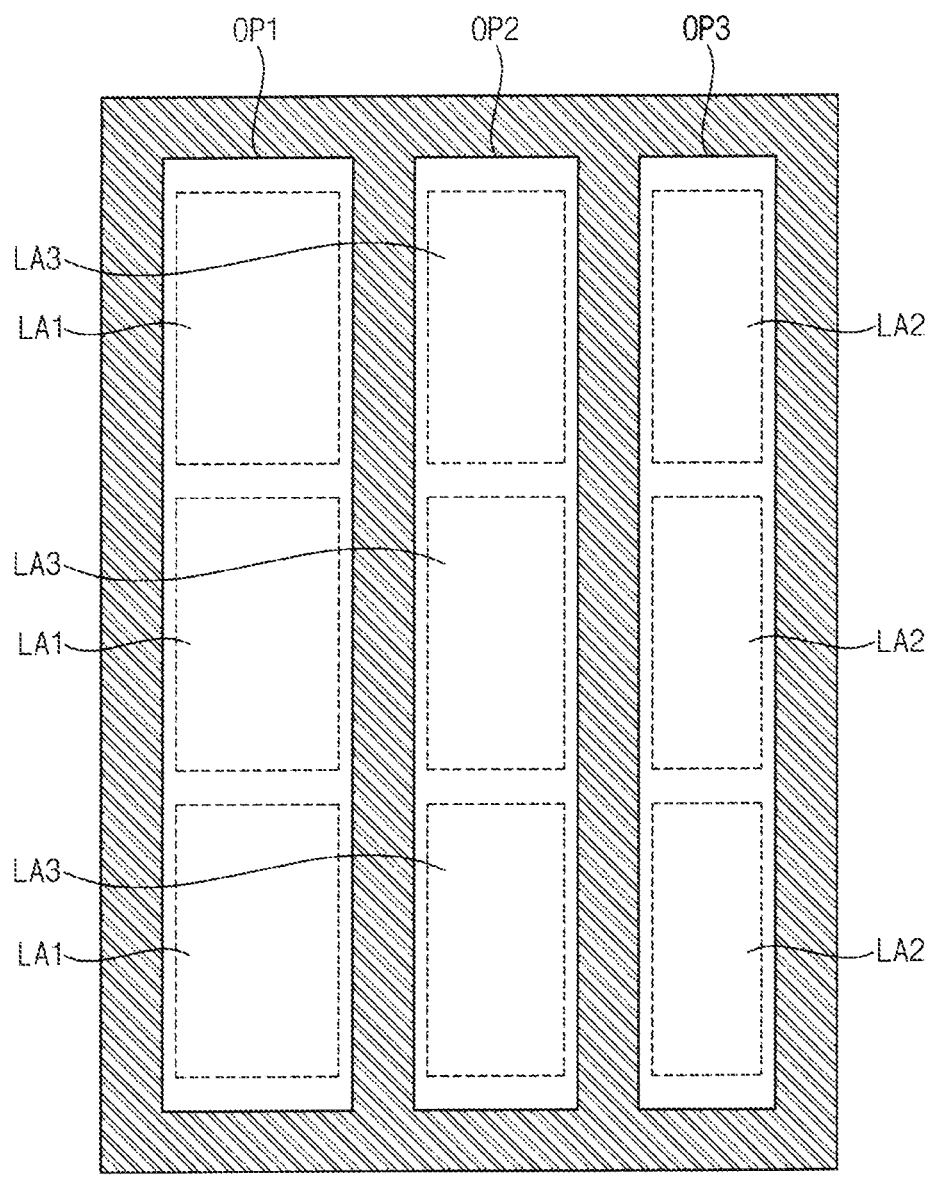
FIGS. 11 and 12 are plan views illustrating light-emitting areas and a partition wall of a color-converting substrate according to an exemplary embodiment.
Figure 12:
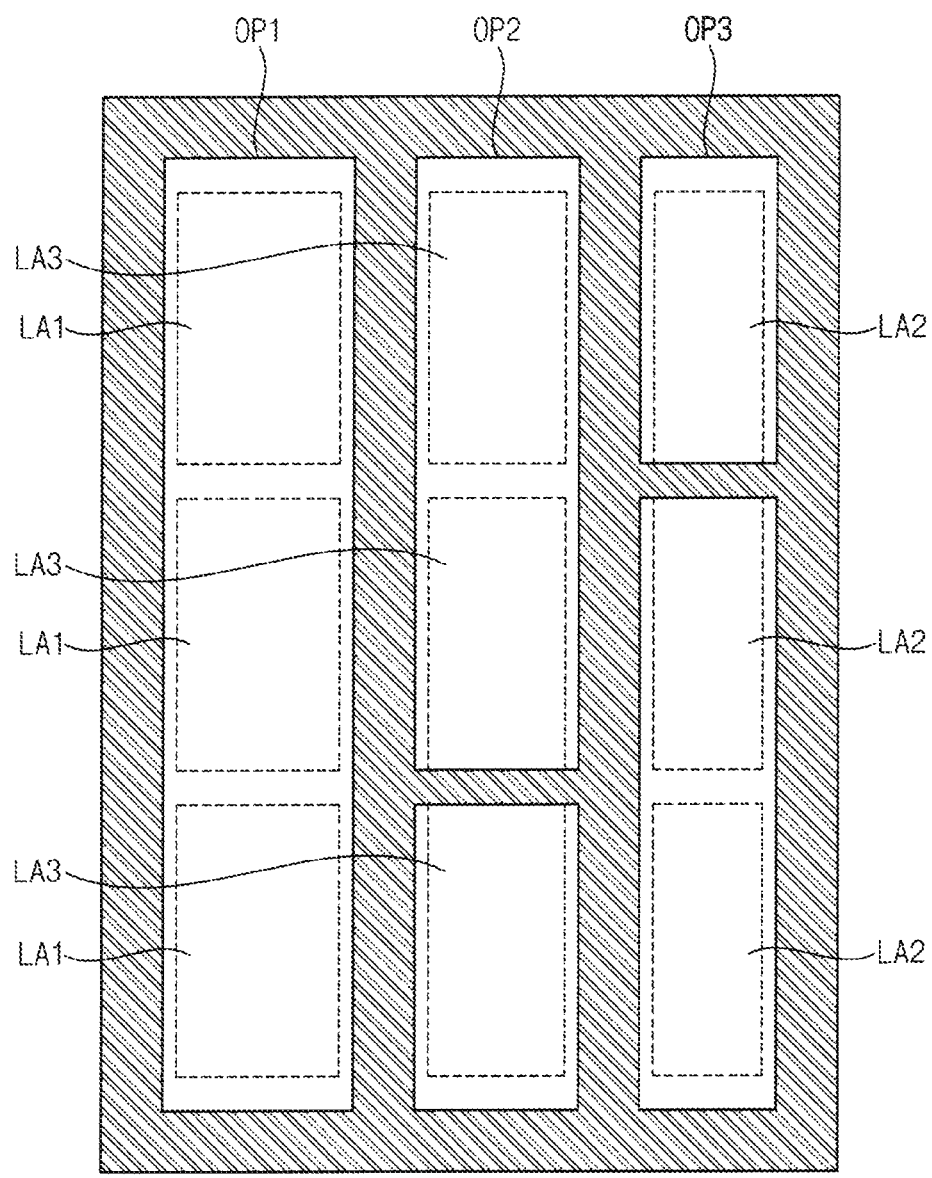

In an exemplary embodiment, an opening of the partition wall may continuously overlap two light-emitting areas. However, the inventive concepts are not limited thereto. For example, openings OP1, OP2 and OP3 of a partition wall 250 may continuously overlap at least three light-emitting areas, respectively, as illustrated in FIG. 11. Furthermore, openings OP1, OP2 and OP3 of the partition wall 250 may have sizes different from each other, or may be shifted in a direction, in view of colors of light-emitting areas and display characteristics, as illustrated in FIG. 12.

Figure 13A:
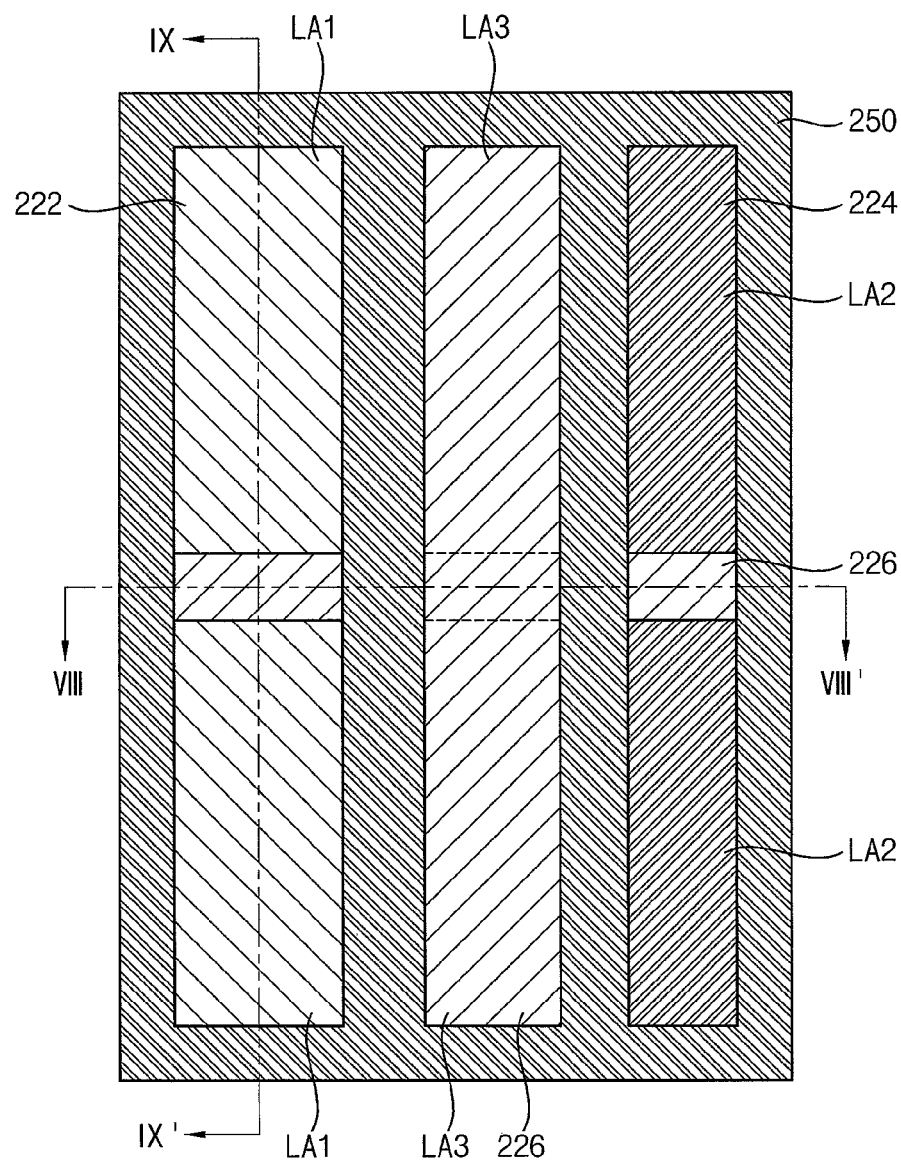
FIG. 13A is a plan view illustrating a color-converting substrate according to an exemplary embodiment.
Figure 13B:
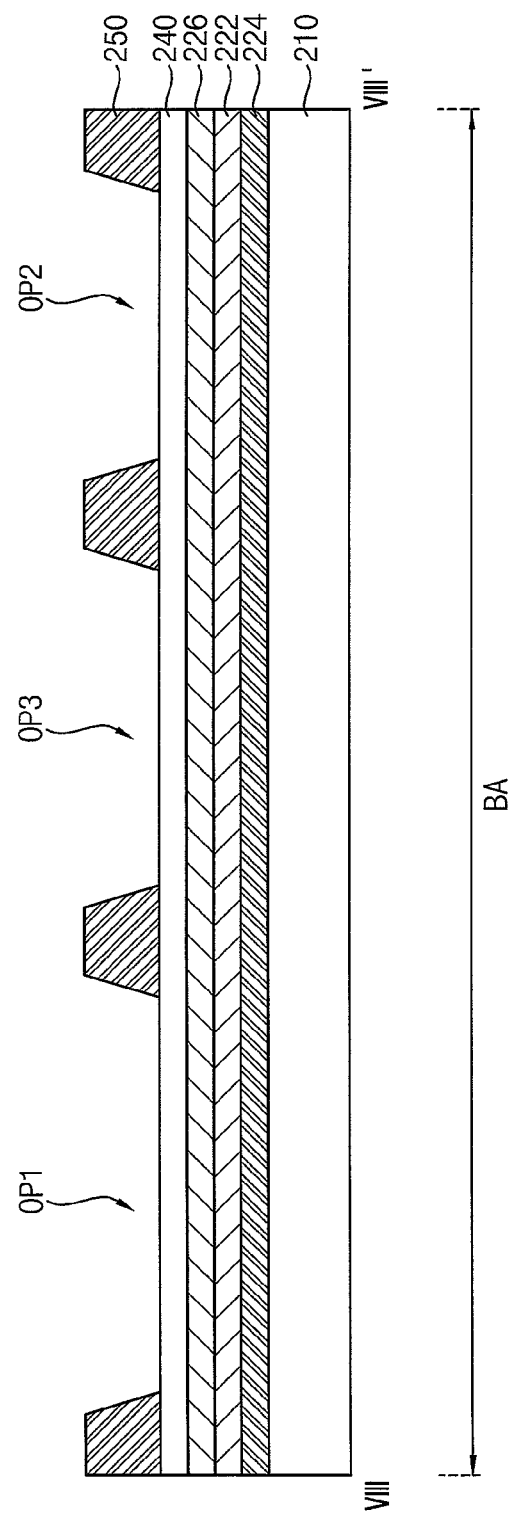
FIG. 13B is a cross-sectional view taken along line VIII-VIII' of FIG. 13A.
Figure 13C:
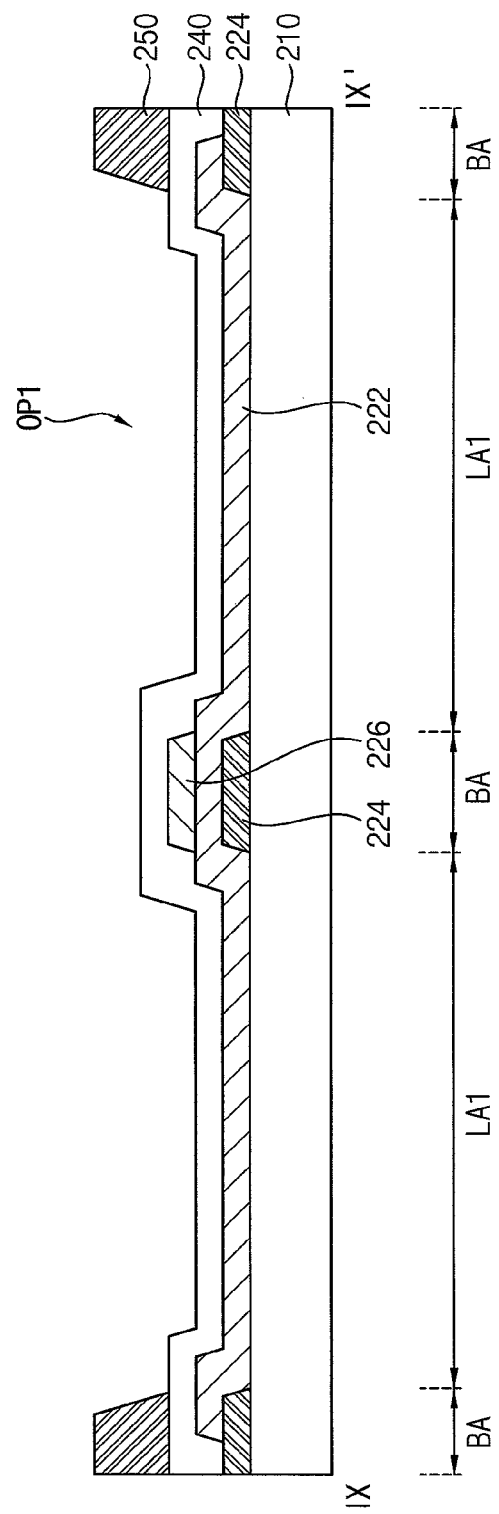
FIG. 13C is a cross-sectional view taken along line IX-IX' of FIG. 13A.

FIG. 13A is a plan view illustrating a color-converting substrate according to an exemplary embodiment. FIG. 13B is a cross-sectional view taken along line VIII-VIII' of FIG. 13A. FIG. 13C is a cross-sectional view taken along line IX-IX' of FIG. 13A. For ease of explanation, a color-converting layer and a compensation layer are not shown in FIGS. 13A to 13C.

Referring to FIGS. 13A, 13B, and 13C, first light-emitting areas LA1 may be arranged along a first direction D1. Second light-emitting areas LA2 and third light-emitting area LA3, which emit light having a color different from the first light-emitting areas LA1, may be arranged along a second direction D2 perpendicular to the first direction D1. In FIG. 13A, the first protective layer 240 is not shown to illustrated a configuration underlying the first protective layer 240.

The first light-emitting area LA1 may overlap a first color filter 222 selectively transmitting a first color light. The second light-emitting area LA2 may overlap a second color filter 224 selectively transmitting a second color light. The third light-emitting area LA3 may overlap a third color filter 226 selectively transmitting a third color light. The first color light may be a red light, the second color light may be a blue light, and the third color light may be a green light.

A partition wall 250 is disposed on the color filter layer. The partition wall 250 has an opening continuously overlapping light-emitting areas emitting the same color light. For example, the partition wall 250 may include a first opening OP1, which overlaps adjacent first light-emitting areas LA1 and a light-blocking area BA therebetween, a second opening OP2, which overlaps adjacent second light-emitting areas LA2 and the light-blocking area BA therebetween, and a third opening OP1, which overlaps adjacent third light-emitting areas LA3 and the light-blocking area BA therebetween.

The partition wall 250 may overlap the light-blocking area BA between adjacent light-emitting areas emitting different color lights.

The light-blocking area BA between adjacent light-emitting areas emitting the same color light may overlap a plurality of color filters.

For example, the light-blocking area BA between adjacent first light-emitting areas LA1 may overlap the first color filter 222, the second color filter 224, and the third color filter 226. Furthermore, the light-blocking area BA between adjacent second light-emitting areas LA2 and between adjacent third light-emitting areas LA3 may overlap the first color filter 222, the second color filter 224, and the third color filter 226.

In an exemplary embodiment, a plurality of color filters are disposed in the light-blocking area BA where the partition wall 250 is not disposed. As such, light leakage may be effectively prevented.

Figure 14A:
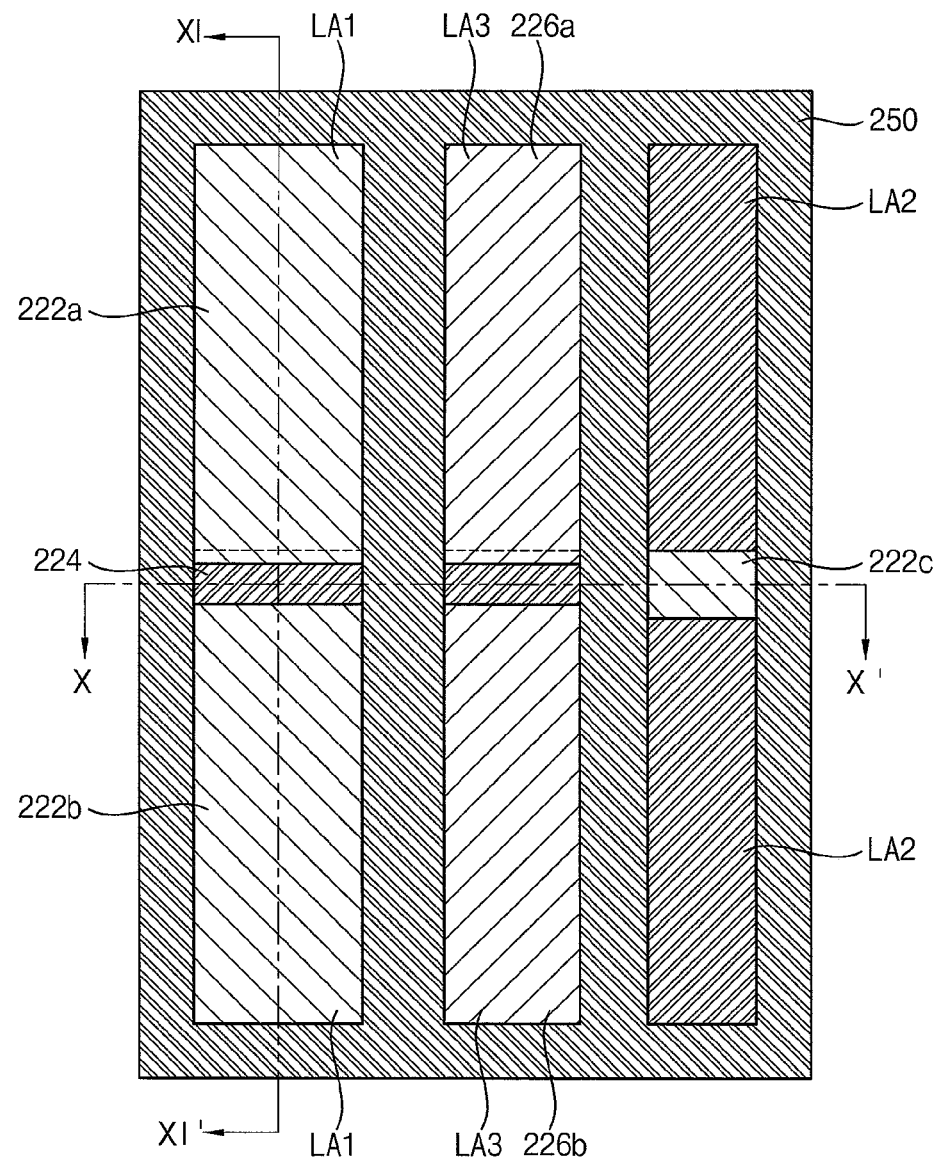
FIG. 14A is a plan view illustrating a color-converting substrate according to an exemplary embodiment.
Figure 14B:
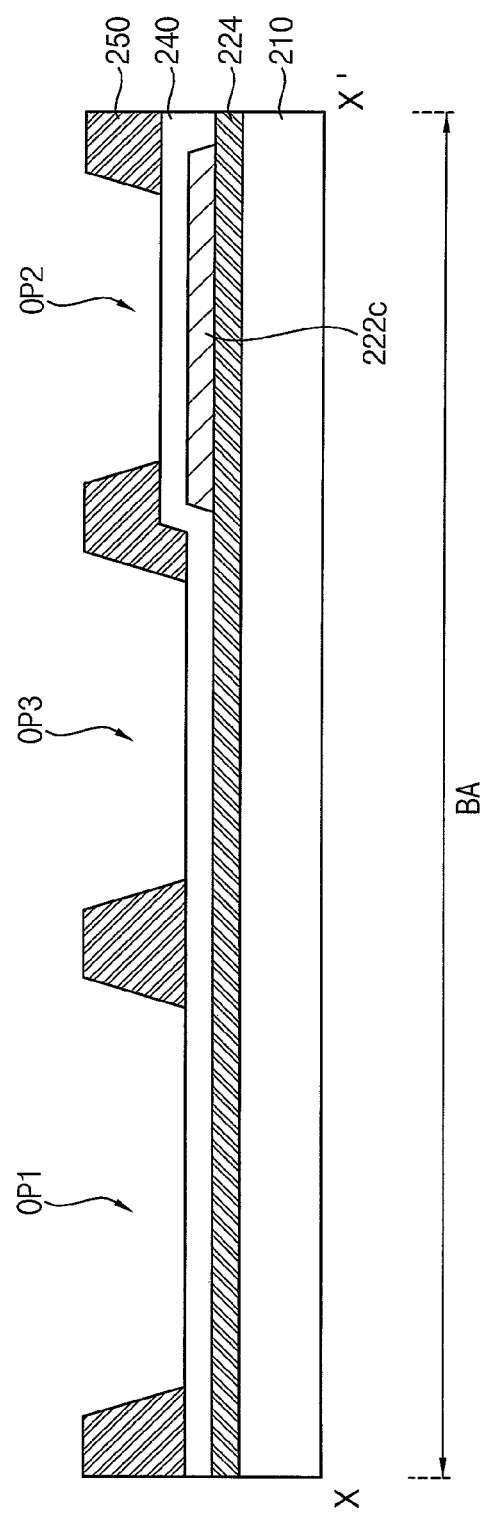
FIG. 14B is a cross-sectional view taken along line X-X' of FIG. 14A.
Figure 14C:
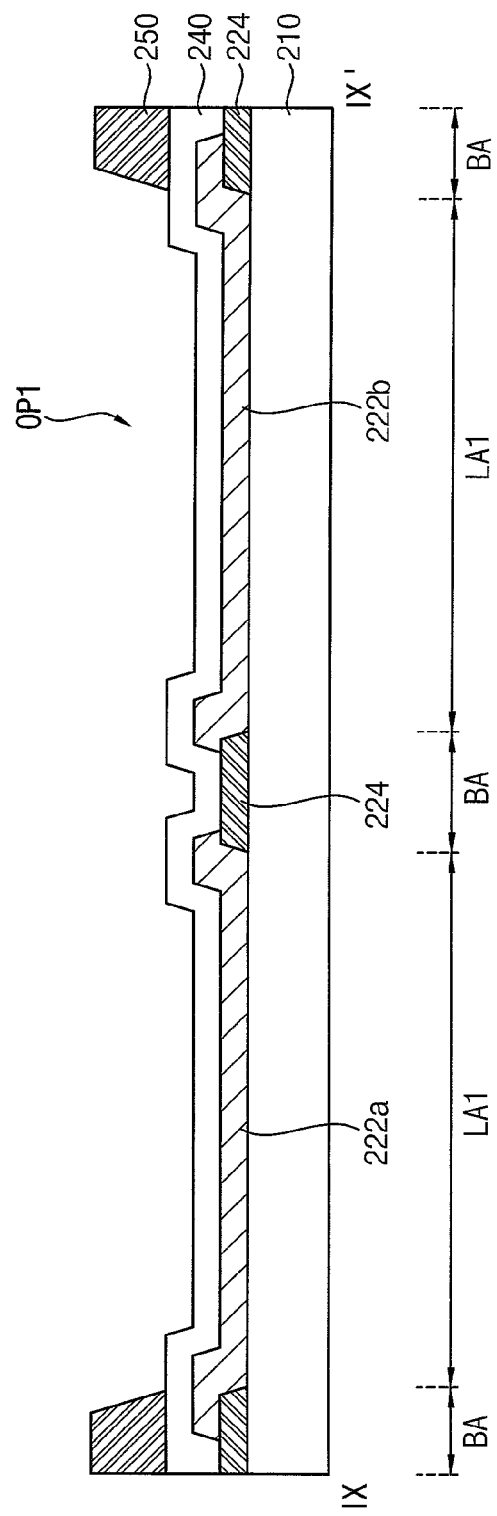
FIG. 14C is a cross-sectional view taken along line XI-XI' of FIG. 14A.

FIG. 14A is a plan view illustrating a color-converting substrate according to an exemplary embodiment. FIG. 14B is a cross-sectional view taken along line X-X' of FIG. 14A. FIG. 14C is a cross-sectional view taken along line XI-XI' of FIG. 14A. For ease of explanation, a color-converting layer and a compensation layer are not illustrated.

Referring to FIGS. 14A, 14B, and 14C, first light-emitting areas LA1 may be arranged along a first direction D1. Second light-emitting areas LA2 and third light-emitting area LA3, which emit light having a color different from the first light-emitting areas LA1, may be arranged along a second direction D2 perpendicular to the first direction D1.

The first light-emitting area LA1 may overlap a first color filter selectively transmitting a first color light. The first color filter may include a plurality of patterns 222a and 222b, which overlap adjacent first light-emitting areas LA1, respectively, and are spaced apart from each other.

The second light-emitting area LA2 may overlap a second color filter 224 selectively transmitting a second color light.

The third light-emitting area LA3 may overlap a third color filter selectively transmitting a third color light. The third color filter may include a plurality of patterns 226a and 226b, which overlap adjacent third light-emitting areas LA3, respectively, and are spaced apart from each other.

For example, the first color light may be a red light, the second color light may be a blue light, and the third color light may be a green light.

A partition wall 250 is disposed on the color filters. The partition wall 250 has an opening continuously overlapping light-emitting areas emitting the same color light. For example, the partition wall 250 may include a first opening OP1, which overlaps adjacent first light-emitting areas LA1 and a light-blocking area BA therebetween, a second opening OP2, which overlaps adjacent second light-emitting areas LA2 and the light-blocking area BA therebetween, and a third opening OP1, which overlaps adjacent third light-emitting areas LA3 and the light-blocking area BA therebetween.

The partition wall 250 may overlap the light-blocking area BA between adjacent light-emitting areas emitting different color lights.

The light-blocking area BA between adjacent light-emitting areas emitting the same color light may overlap a plurality of color filters.

For example, the light-blocking area BA between adjacent first light-emitting areas LA1 may overlap the second color filter 224. The light-blocking area BA between adjacent third light-emitting areas LA3 may overlap the second color filter 224. The light-blocking area BA between adjacent second light-emitting areas LA2 may overlap a dummy pattern 222c of the first color filter.

In an exemplary embodiment, the color filter may not continuously extend across adjacent light-emitting areas emitting the same color light, and may include separated patterns corresponding to each of the light-emitting areas. As such, a color filter may be partially removed in the light-blocking area BA between adjacent light-emitting areas emitting the same color light. As such, a volume of the opening may be increased such that more ink drops may be received therein. In this manner, a thickness distribution of a color-converting layer and a compensation layer due to distribution of ink drops may be reduced.

Figure 15:
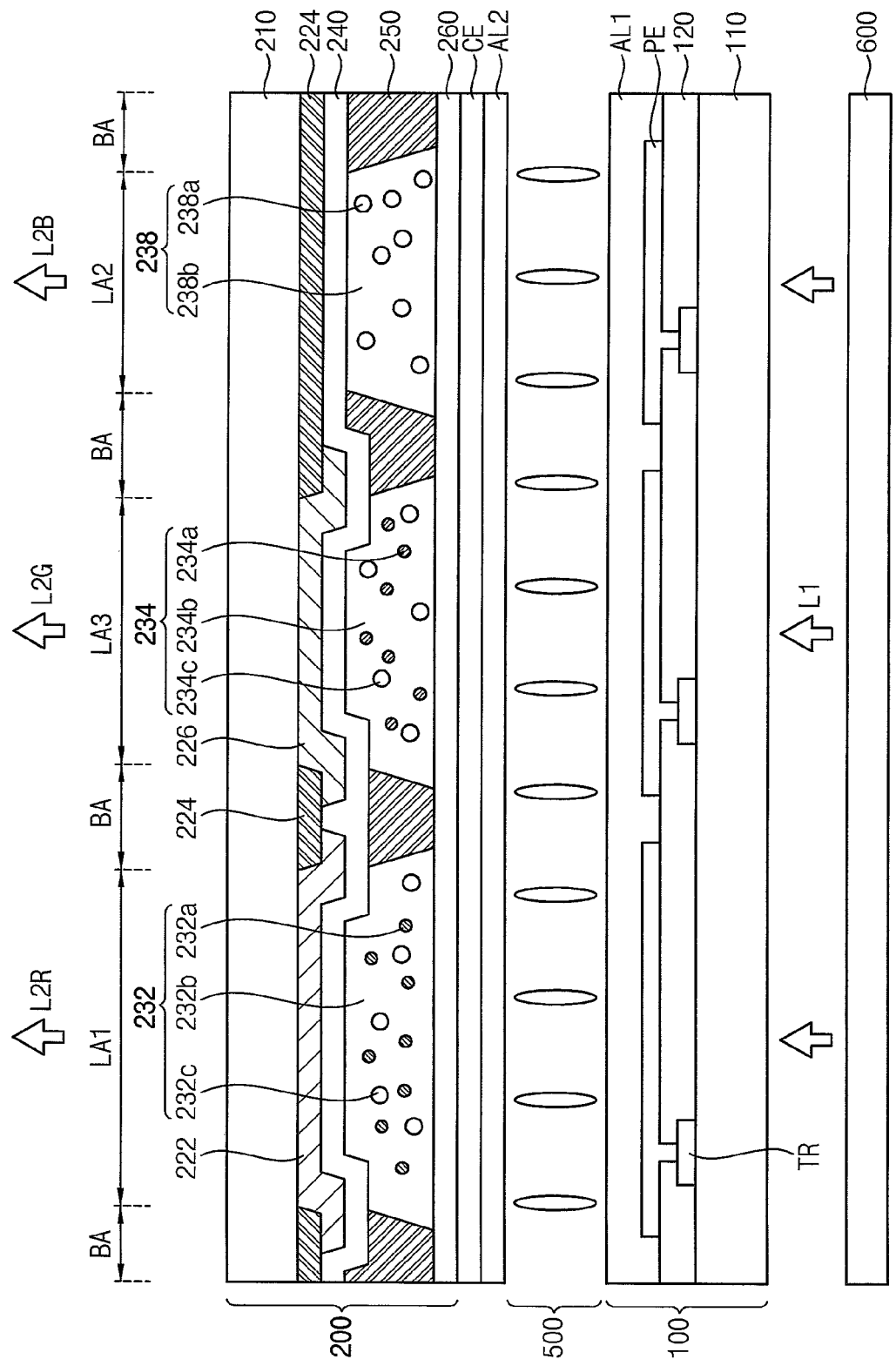
FIG. 15 is a cross-sectional view illustrating a display device according to an exemplary embodiment.

FIG. 15 is a cross-sectional view illustrating a display device according to an exemplary embodiment.

Referring to FIG. 15, a display device includes a display panel and a backlight assembly 600. The display panel includes a first substrate 100 and a second substrate 200.

The first substrate 100 includes an array of pixels. A liquid crystal layer 500 is interposed between the first substrate 100 and the second substrate 200.

A pixel includes a driving element TR and a pixel electrode PE electrically connected to the driving element TR. The second substrate 200 includes a common electrode CE. However, the inventive concepts are not limited thereto. For example, the common electrode CE may be included in the first substrate 100.

A first alignment layer AL1 may be disposed on the pixel electrode PE. A second alignment layer AL2 may be disposed on the second substrate 200. The first and second alignment layers AL1 and AL2 may include a polymer such as polyimide, and may be treated by rubbing or photo-orientation to have a predetermined tilt angle or the like.

The second substrate 200 may have substantially the same configuration as one of the color-converting substrates described above, except for further including the common electrode CE and the second alignment layer AL2.

A pixel voltage is applied to the pixel electrode PE in response to operation of the driving element TR. A common voltage is applied to the common electrode CE. Orientation of liquid crystal molecules in the liquid crystal layer 500 is adjusted by an electric field formed by a difference between the pixel voltage and the common voltage. As such, a transmittance of light L1 provided by the backlight assembly 600 may be controlled.

The second substrate 200 includes a color-converting layer, which changes a wavelength of light L1 passing through the liquid crystal layer 500 to emit light having a color different from the incident light L1. Furthermore, the second substrate 200 includes a color filter overlapping the color-converting layer.

For example, the second substrate 200 includes a color filter layer disposed on a surface of a base substrate 210. The color filter layer may be disposed between the base substrate 210 and the color-converting layer. The color filter layer may filter light passing therethrough to output light having a specific color.

In an exemplary embodiment, the color filter layer may include a first color filter 222, a second color filter 224, and a third color filter 226. The color filters may overlap a corresponding light-emitting area. As such, colors of light L2R, L2G and L2B exiting from the light-emitting areas may be determined by their color filters.

In an exemplary embodiment, the first color filter 222 overlaps the first light-emitting area LA1. For example, the first color filter 222 may selectively transmit a red light. The second color filter 224 overlaps the second light-emitting area LA2. For example, the second color filter 224 may selectively transmit a blue light. The third color filter 226 overlaps the third light-emitting area LA3. For example, the third color filter 226 may selectively transmit a green light.

As described above, a color-converting substrate may be used for a light crystal display device as well. Furthermore, exemplary embodiments may be used for various display devices, which may use a color-converting substrate, such as an electroluminescent display device, a micro LED display device or the like.

Exemplary embodiments may be applied to various display devices. For example, exemplary embodiments may be applied to vehicle-display device, a ship-display device, an aircraft-display device, portable communication devices, display devices for display or for information transfer, a medical-display device, etc.

According to one or more exemplary embodiments, a partition wall may not be disposed in a light-blocking area between adjacent light-emitting areas emitting the same light. As such, the total number of ink drops provided in each opening of the partition wall may be increased, which may reduce volume distribution of the ink drops. As such, the color-converting layer and the compensation layer formed in the expanded opening may have a reduced thickness distribution.

Furthermore, a color filter having a different color from an output light of an adjacent light-emitting area is disposed in the light-blocking area where the partition wall is removed. As such, deterioration of a display quality due to light leakage may be prevented.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A color-converting substrate comprising:
light-emitting areas and a light blocking area surrounding the light-emitting areas, the light-emitting areas including first light-emitting areas configured to emit a first color light;
a pair of adjacent partition walls facing each other to define a first opening continuously overlapping the first light-emitting areas and a first portion of the light-blocking area disposed between the first light-emitting areas in a plan view;
a first color-converting layer including a wavelength-converting material and disposed in the first opening to overlap the first light-emitting areas and the first portion of the light-blocking area in a plan view; and
a color filter layer including a portion configured to block the first color light, the color filter layer overlapping the first color-converting layer and the first portion of the light-blocking area in a plan view.

2. The color-converting substrate of claim 1, wherein:
the light-emitting areas further include second light-emitting areas configured to emit a second color light different from the first color light; and
the color filter layer includes:
a first color filter overlapping the first light-emitting areas and configured to transmit the first color light; and
a second color filter overlapping the second light-emitting areas and the first portion of the light-blocking area and configured to transmit the second color light.

3. The color-converting substrate of claim 2, wherein the first color filter further overlaps a second portion of the light-blocking area disposed between the second light-emitting areas.

4. The color-converting substrate of claim 3, further comprising a compensation layer overlapping the second light-emitting areas and the second portion of the light-blocking area, and configured to transmit an incident light without changing a wavelength of the incident light.

5. The color-converting substrate of claim 4, further including a second color-converting layer including a wavelength-converting material and overlapping third light-emitting areas and a third portion of the light-blocking area disposed between the third light-emitting areas, the third light-emitting areas being configured to emit a third color light different from the first color light and the second color light,
wherein the color filter layer further includes a third color filter overlapping the third light-emitting areas and configured to transmit the third color light.

6. The color-converting substrate of claim 5, wherein the first color light is a red light, the second color light is a blue light, and the third color light is a green light.

7. The color-converting substrate of claim 5, wherein the second color filter further overlaps the third portion of the light-blocking area.

8. The color-converting substrate of claim 5, wherein the third color filter further overlaps the third portion of the light-blocking area.

9. The color-converting substrate of claim 4, wherein:
the pair of partition walls further define a second opening in which the compensation layer is disposed; and
the first opening and the second opening have different sizes.

10. The color-converting substrate of claim 1, wherein the first color filter includes a plurality of patterns spaced apart from each other and overlapping the first light-emitting areas, respectively.

11. The color-converting substrate of claim 1, wherein the wavelength-converting material includes a quantum dot.

12. A display device comprising:
a first substrate including an array of pixels; and
a second substrate combined with the first substrate and including light-emitting areas and a light-blocking area, the light-emitting areas including first light-emitting areas configured to emit a first color light and second light-emitting areas configured to emit a second color light different from the first color light,
wherein the second substrate further includes:
a pair of adjacent partition walls facing each other to define a first opening continuously overlapping the first light-emitting areas and a first portion of the light-blocking area disposed between the first light-emitting areas in a plan view;
a first color-converting layer including a wavelength-converting material and disposed in the first opening to overlap the first light-emitting areas and the first portion of the light-blocking area in a plan view;
a first color filter overlapping the first light-emitting areas in a plan view and configured to transmit the first color light; and
a second color filter overlapping the second light-emitting areas and the first portion of the light-blocking area in a plan view and configured to transmit the second color light.

13. The display device of claim 12, wherein the first color filter further overlaps a second portion of the light-blocking area disposed between the second light-emitting areas.

14. The display device of claim 13, wherein the second substrate further includes a compensation layer overlapping the second light-emitting areas and the second portion of the light-blocking area, and configured to transmit an incident light without changing a wavelength of the incident light.

15. The display device of claim 14, wherein:
the light-emitting areas further include third light-emitting areas configured to emit a third color light different from the first color light and the second color light; and
the second substrate further includes:
a third color filter overlapping the third light-emitting areas and configured to transmit the third color light; and
a second color-converting layer including a wavelength-converting material and overlapping the third light-emitting areas and a third portion of the light-blocking area disposed between the third light-emitting areas.

16. The display device of claim 15, wherein the first color light is a red light, the second color light is a blue light, and the third color light is a green light.

17. The display device of claim 15, wherein the second color filter further overlaps the third portion of the light-blocking area.

18. The display device of claim 12, wherein the first color filter includes a plurality of patterns spaced apart from each other and overlapping the first light-emitting areas, respectively.

19. The display device of claim 12, wherein the wavelength-converting material includes a quantum dot.

* * * * *